(12) United States Patent
Shih et al.

(10) Patent No.: US 11,574,911 B2
(45) Date of Patent: Feb. 7, 2023

(54) METHOD FOR FABRICATING SEMICONDUCTOR DEVICE WITH PROTRUDING CONTACT

(71) Applicant: NANYA TECHNOLOGY CORPORATION, New Taipei (TW)

(72) Inventors: Chiang-Lin Shih, New Taipei (TW); Chih-Hung Chen, Taoyuan (TW); Szu-Yao Chang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/544,663

(22) Filed: Dec. 7, 2021

(65) Prior Publication Data

US 2022/0122982 A1    Apr. 21, 2022

Related U.S. Application Data

(62) Division of application No. 17/071,444, filed on Oct. 15, 2020, now Pat. No. 11,469,231.

(51) Int. Cl.
*H01L 27/108* (2006.01)

(52) U.S. Cl.
CPC .. *H01L 27/10814* (2013.01); *H01L 27/10823* (2013.01); *H01L 27/10855* (2013.01); *H01L 27/10885* (2013.01)

(58) Field of Classification Search
None
See application file for complete search history.

(56) References Cited

U.S. PATENT DOCUMENTS

| | | | | |
|---|---|---|---|---|
| 9,425,200 | B2* | 8/2016 | Hwang | H01L 27/10888 |
| 10,811,420 | B2* | 10/2020 | Chen | H01L 21/76801 |
| 11,133,318 | B2* | 9/2021 | Chung | H01L 27/10885 |
| 2007/0218682 | A1 | 9/2007 | Lee et al. | |
| 2017/0103987 | A1 | 4/2017 | Kim et al. | |
| 2020/0185387 | A1* | 6/2020 | Lim | H01L 27/10882 |
| 2021/0082924 | A1* | 3/2021 | Seong | H01L 27/10894 |
| 2021/0134804 | A1* | 5/2021 | Jung | H01L 27/10852 |
| 2021/0233841 | A1* | 7/2021 | Kubo | H01L 23/5286 |
| 2021/0249703 | A1* | 8/2021 | Ikeda | H01L 27/1225 |

FOREIGN PATENT DOCUMENTS

| | | |
|---|---|---|
| TW | 202021042 A | 6/2020 |
| TW | I701726 B | 8/2020 |

OTHER PUBLICATIONS

Office Action dated Aug. 3, 2022 related to Taiwanese Application No. 110124409.

(Continued)

*Primary Examiner* — Steven M Christopher
(74) *Attorney, Agent, or Firm* — Xuan Zhang

(57) ABSTRACT

The present application discloses a method for fabricating a semiconductor device with a protruding contact. The method includes providing a substrate; forming a bit line structure on the substrate; forming a capacitor contact structure next to the bit line structure; recessing a top surface of the bit line structure; and forming a landing pad layer covering a portion of a top surface of the capacitor contact structure and an upper portion of a sidewall of the capacitor contact structure.

18 Claims, 44 Drawing Sheets

(56) References Cited

OTHER PUBLICATIONS

Summary translation of Office Action dated Aug. 3, 2022 related to Taiwanese Application No. 110124409.
Office Action dated Apr. 22, 2022 related to U.S. Appl. No. 17/071,444. This application is a DIV of U.S. Appl. No. 17/071,444.
Office Action dated Jan. 3, 2022 related to U.S. Appl. No. 17/071,444. This application is a DIV of U.S. Appl. No. 17/071,444.

\* cited by examiner

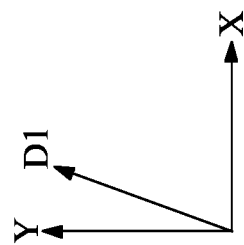
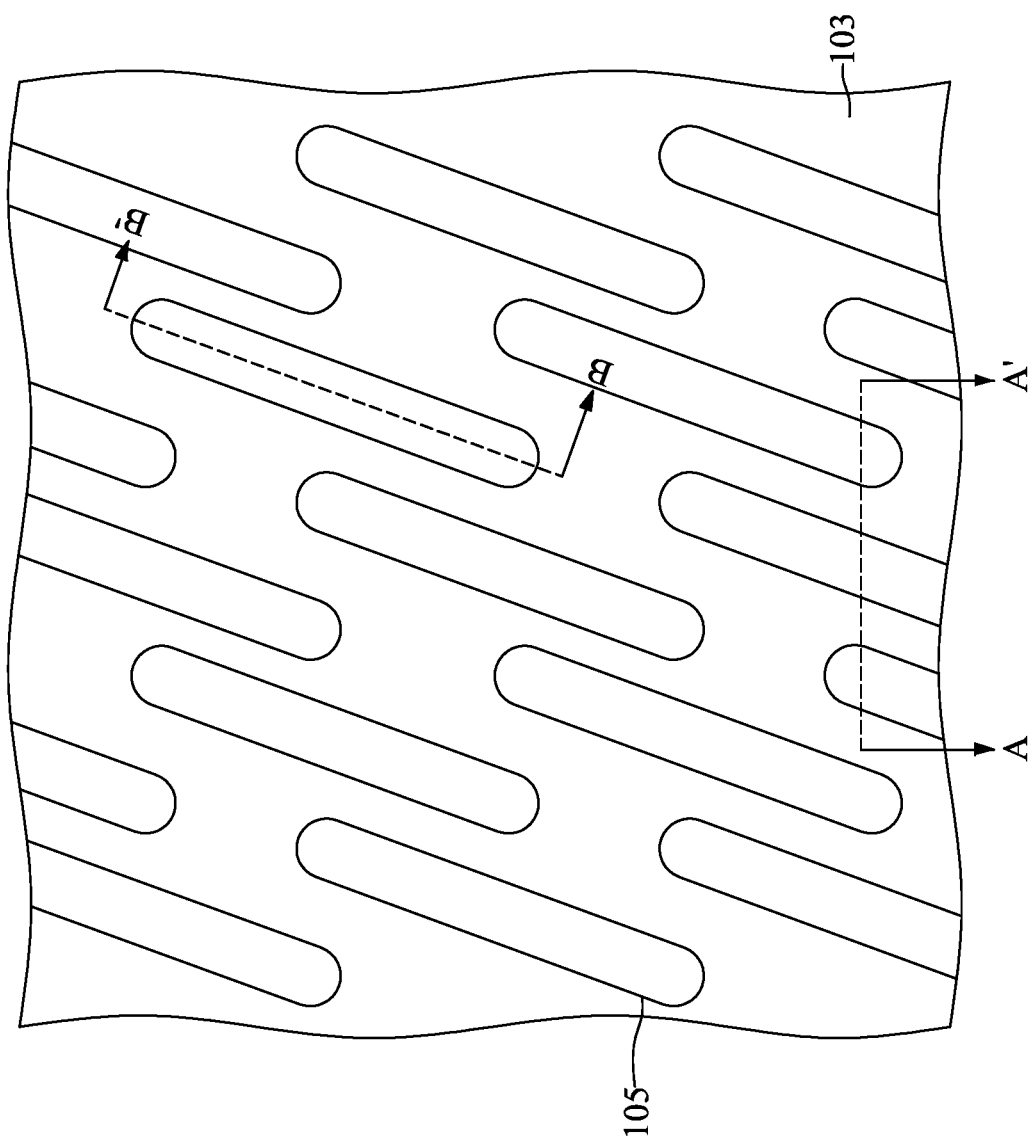
FIG. 2

FIG. 41

METHOD FOR FABRICATING SEMICONDUCTOR DEVICE WITH PROTRUDING CONTACT

CROSS-REFERENCE TO RELATED APPLICATION

This application is a divisional application of U.S. Non-Provisional application Ser. No. 17/071,444 filed Oct. 15, 2020, which is incorporated herein by reference in its entirety.

TECHNICAL FIELD

The present disclosure relates to a method for fabricating a semiconductor device, and more particularly, to a method for fabricating a semiconductor device with a protruding contact and a method for fabricating the semiconductor device with the protruding contact.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a capacitor contact structure protruding from the substrate, and a landing pad layer covering a portion of a top surface of the capacitor contact structure and an upper portion of a sidewall of the capacitor contact structure.

In some embodiments, the semiconductor device includes a bit line structure positioned on the substrate and positioned next to the capacitor contact structure. A top surface of the bit line structure is at a vertical level lower than a vertical level of the top surface of the capacitor contact structure.

In some embodiments, the semiconductor device includes a bit line spacer positioned between the capacitor contact structure and the bit line structure. A top surface of the bit line spacer is substantially coplanar with the top surface of the bit line structure.

In some embodiments, the bit line structure includes a bit line bottom conductive layer positioned on the substrate, a bit line middle conductive layer positioned on the bit line bottom conductive layer, a bit line top conductive layer positioned on the bit line middle conductive layer, and a bit line capping layer positioned on the bit line top conductive layer.

In some embodiments, the capacitor contact structure includes a capacitor contact bottom conductive layer protruding from the substrate, a capacitor contact middle conductive layer positioned on the capacitor contact bottom conductive layer, and a capacitor contact top conductive layer positioned on the capacitor contact middle conductive layer, and the landing pad layer covers a portion of a top surface of the capacitor contact top conductive layer and an upper portion of a sidewall of the capacitor contact top conductive layer.

In some embodiments, the capacitor contact bottom conductive layer is formed of polycrystalline silicon, polycrystalline germanium, or polycrystalline silicon germanium, the capacitor contact middle conductive layer is formed of cobalt silicide, titanium silicide, nickel silicide, nickel platinum silicide, or tantalum silicide, and the capacitor contact top conductive layer is formed of titanium nitride or tantalum nitride.

In some embodiments, a bottom surface of the capacitor contact structure is at a vertical level lower than a vertical level of a bottom surface of the bit line spacer.

In some embodiments, the semiconductor device includes a bit line contact positioned under the bit line bottom conductive layer.

In some embodiments, a bottom surface of the bit line spacer is substantially coplanar with a bottom surface of the bit line contact.

In some embodiments, the semiconductor device includes source/drain regions positioned under the bit line contact and the capacitor contact structure.

In some embodiments, the semiconductor device includes an insulation structure positioned between the bit line structure and the capacitor contact structure and including a first insulating layer and a second insulating layer. The first insulating layer includes a bottom portion horizontally positioned on the substrate and two side portions vertically connected to two ends of the bottom portion, and the second insulating layer is positioned among the bottom portion and the two side portions.

In some embodiments, the first insulating layer is formed of silicon nitride and the second insulating layer is formed of silicon oxide.

In some embodiments, the semiconductor device includes an insulation structure positioned between the bit line structure and the capacitor contact structure and including a first insulating layer and an air gap. The first insulating layer includes a bottom portion horizontally positioned on the substrate and two side portions vertically connected to two ends of the bottom portion, and the air gap is positioned among the bottom portion and the two side portions.

In some embodiments, the capacitor contact structure includes a capacitor contact bottom conductive layer protruding from the substrate, the landing pad layer covers a portion of a top surface of the capacitor contact bottom conductive layer and an upper portion of a sidewall of the capacitor contact bottom conductive layer, and the capacitor contact bottom conductive layer is formed of polycrystalline silicon, polycrystalline germanium, or polycrystalline silicon germanium.

In some embodiments, the semiconductor device includes an adjustment layer positioned between the landing pad layer and the capacitor contact bottom conductive layer. The adjustment layer is formed of cobalt silicide, titanium silicide, nickel silicide, nickel platinum silicide, or tantalum silicide.

In some embodiments, the capacitor contact structure includes a capacitor contact bottom conductive layer protruding from the substrate, the landing pad layer covers a portion of a top surface of the capacitor contact bottom conductive layer and an upper portion of a sidewall of the capacitor contact bottom conductive layer, and the capacitor contact bottom conductive layer is formed of titanium nitride or tantalum nitride.

Another aspect of the present disclosure provides a method for fabricating a semiconductor device including providing a substrate, forming a bit line structure on the substrate, forming a capacitor contact structure next to the bit line structure, recessing a top surface of the bit line structure, and forming a landing pad layer covering a portion of a top surface of the capacitor contact structure and an upper portion of a sidewall of the capacitor contact structure.

In some embodiments, the bit line structure includes a bit line bottom conductive layer formed on the substrate, a bit line middle conductive layer formed on the bit line bottom conductive layer, a bit line top conductive layer positioned on the bit line middle conductive layer, and a bit line capping layer formed on the bit line top conductive layer.

In some embodiments, the step of forming the landing pad layer includes forming a conductive layer covering an upper portion of the capacitor contact structure, and performing an etch process to turn the conductive layer into the landing pad layer. An etch rate ratio of the conductive layer to the capacitor contact structure is between about 100:1 and about 10:1 during the etch process.

In some embodiments, the capacitor contact structure includes polycrystalline silicon, polycrystalline germanium, polycrystalline silicon germanium, cobalt silicide, titanium silicide, nickel silicide, nickel platinum silicide, or tantalum silicide, titanium nitride, or tantalum nitride.

Due to the design of the semiconductor device of the present disclosure, the contact surface between the landing pad layer and the capacitor contact structure may be increased. Accordingly, the resistance between the landing pad layer and the capacitor contact structure may be reduced. As a result, the power consumption of the semiconductor device may be reduced. In addition, the protruding capacitor contact structure may provide strong enough supporting for the landing pad layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 illustrates, in a schematic top-view diagram, an intermediate semiconductor device in accordance with one embodiment of the present disclosure;

FIGS. 37 to 44 are schematic cross-sectional view diagrams taken along the line A-A' in FIG. 17 illustrating flows for fabricating semiconductor devices in accordance with some embodiment of the present disclosure.

DETAILED DESCRIPTION

Figure 1:
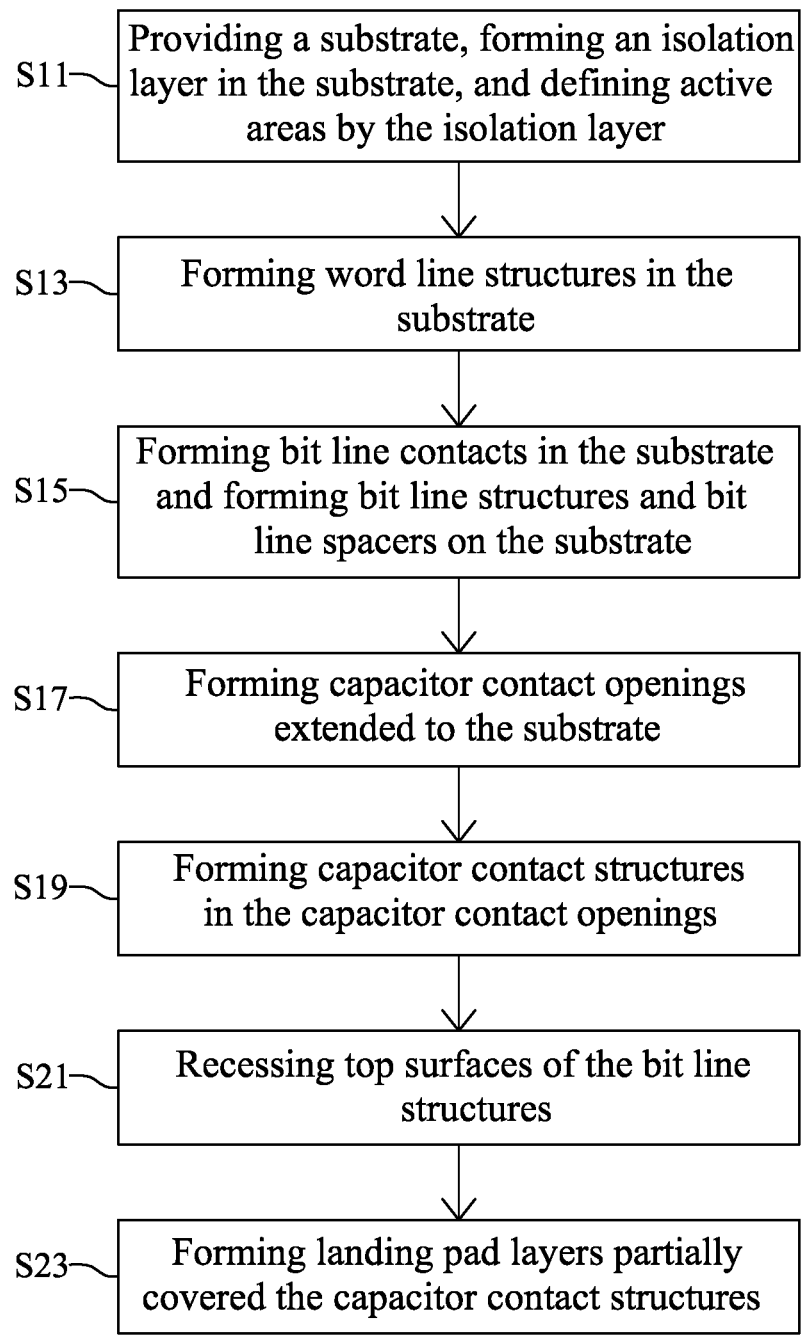
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the axis Z, and below (or down) corresponds to the opposite direction of the arrow of the axis Z.

Figure 3:
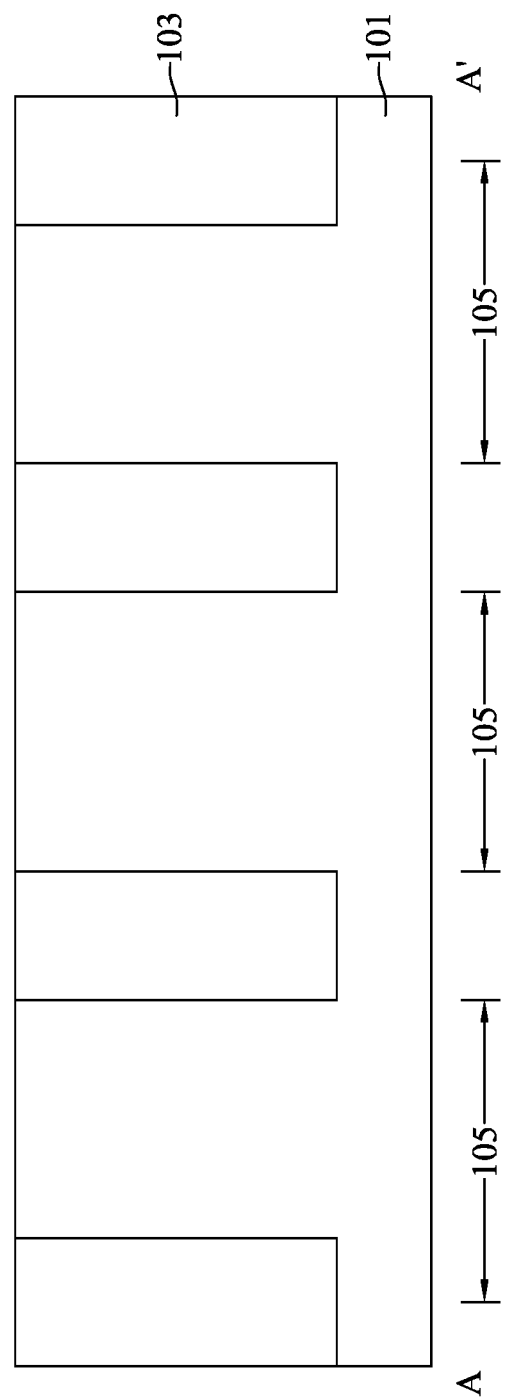
FIGS. 3 and 4 are schematic cross-sectional view diagrams respectively taken along the line A-A' and the line B-B' in FIG. 2.
Figure 4:
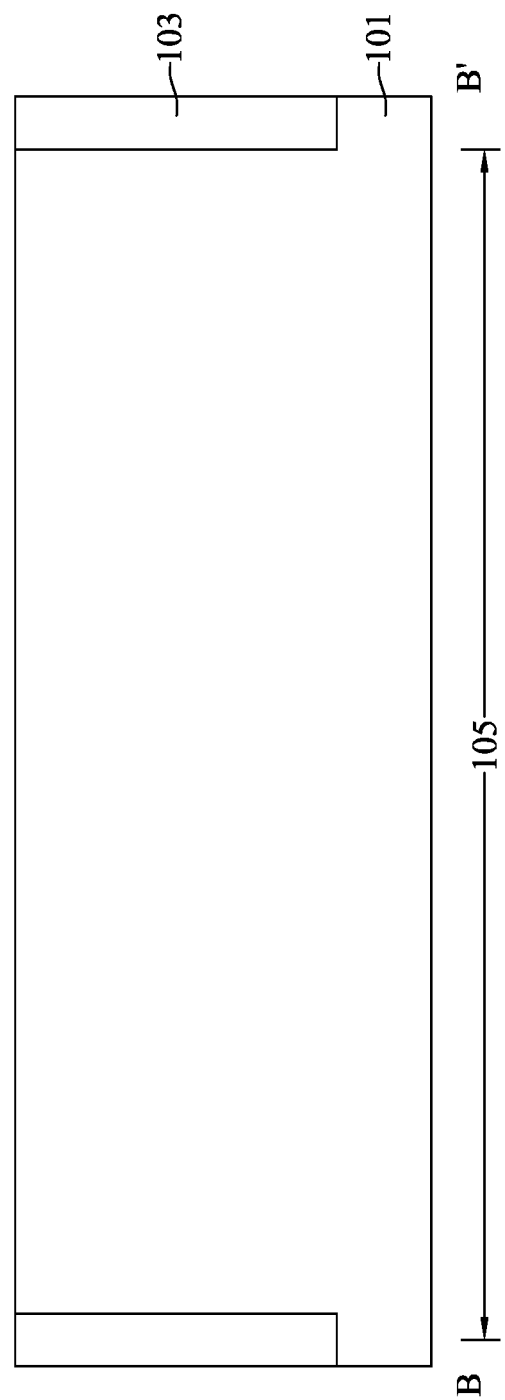

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIGS. 3 and 4 are schematic cross-sectional view diagrams respectively taken along the line A-A' and the line B-B' in FIG. 2 illustrating part of a flow for fabricating the semiconductor device 1A in accordance with one embodiment of the present disclosure.

With reference to FIGS. 1 to 4, at step S11, a substrate 101 may be provided, an isolation layer 103 may be formed in the substrate 101, and active areas 105 may be defined by the isolation layer 103.

With reference to FIGS. 2 to 4, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

With reference to FIGS. 2 to 4, the isolation layer 103 may be formed in the substrate 101. The top surface of the isolation layer 103 may be substantially coplanar with the top surface of the substrate 101. The isolation layer 103 may be formed of, for example, an insulating material such as silicon oxide, silicon nitride, silicon oxynitride, silicon nitride oxide, or fluoride-doped silicate. It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 2 to 4, the isolation layer 103 may surround portions of the substrate 101. The surrounded portions of the substrate 101 may be referred to as the active areas 105. In a top-view perspective, the active areas 105 may be bar shapes. Each of the active areas 105 may extend in a first direction D1. The active areas 105 may be arranged along a first axis X and a second axis Y. The active areas 105 may be spaced apart from each other in the first direction D1. The first axis X and the second axis are perpendicular to each other. The first direction D1 may be slanted with respect to the first axis X and the second axis Y.

Figure 5:
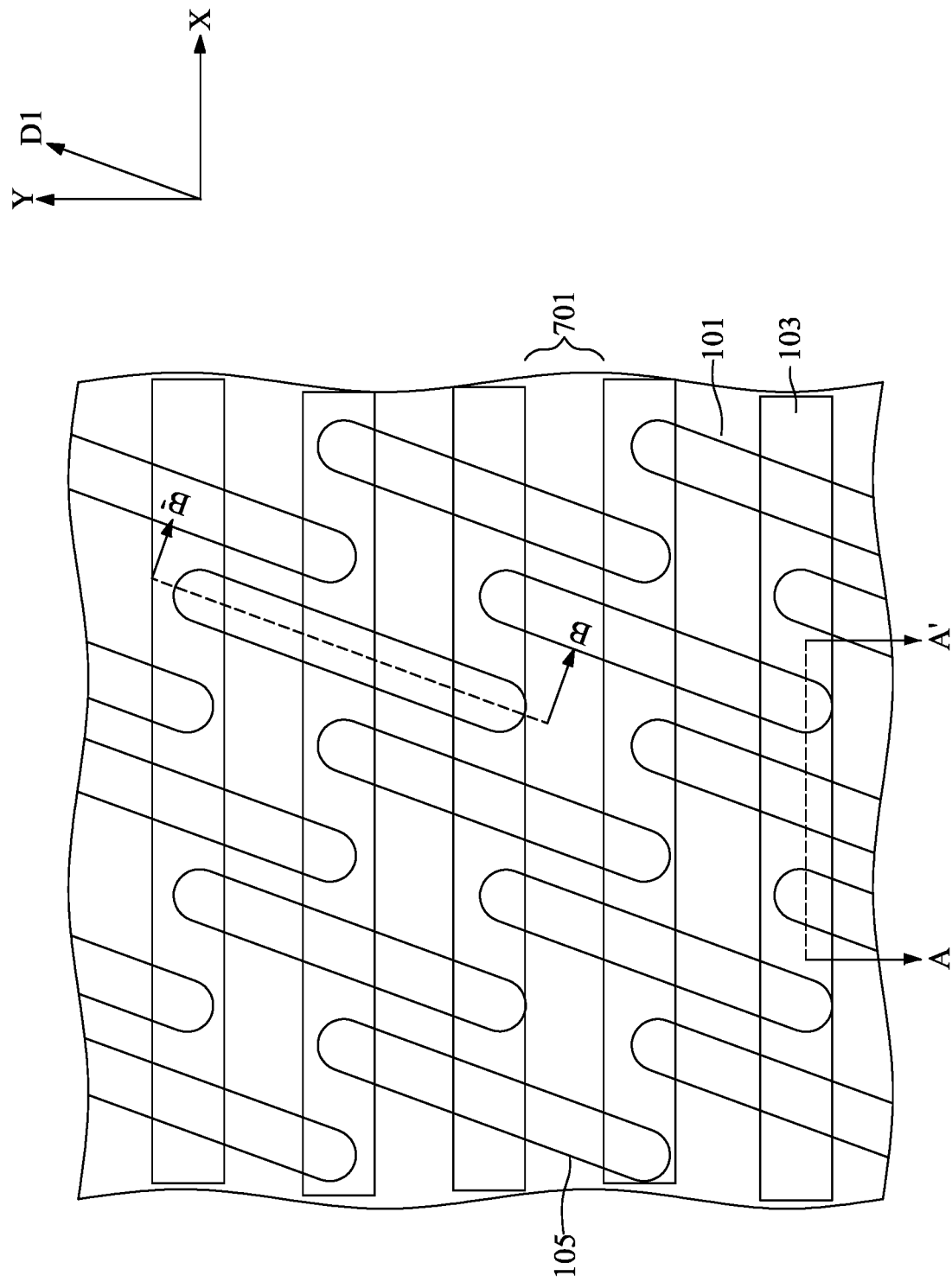
FIG. 5 illustrates, in a schematic top-view diagram, an intermediate semiconductor device in accordance with one embodiment of the present disclosure.
Figure 6:
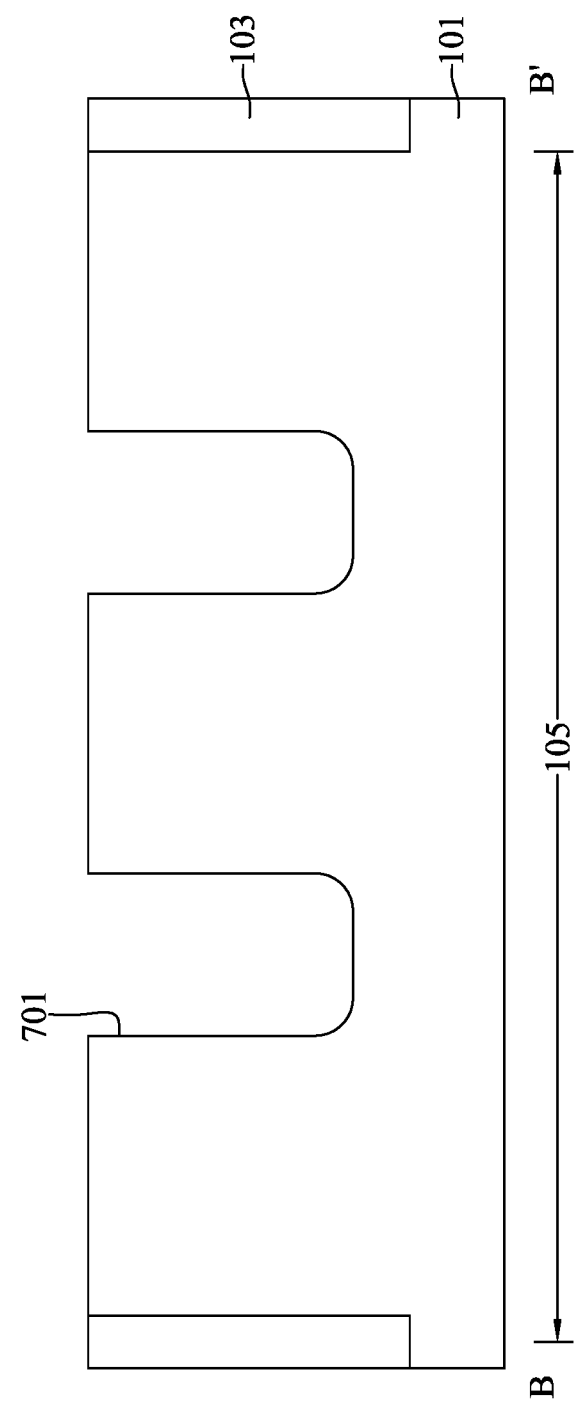
FIG. 6 is a schematic cross-sectional view diagram taken along the line B-B' in FIG. 5.
Figure 7:
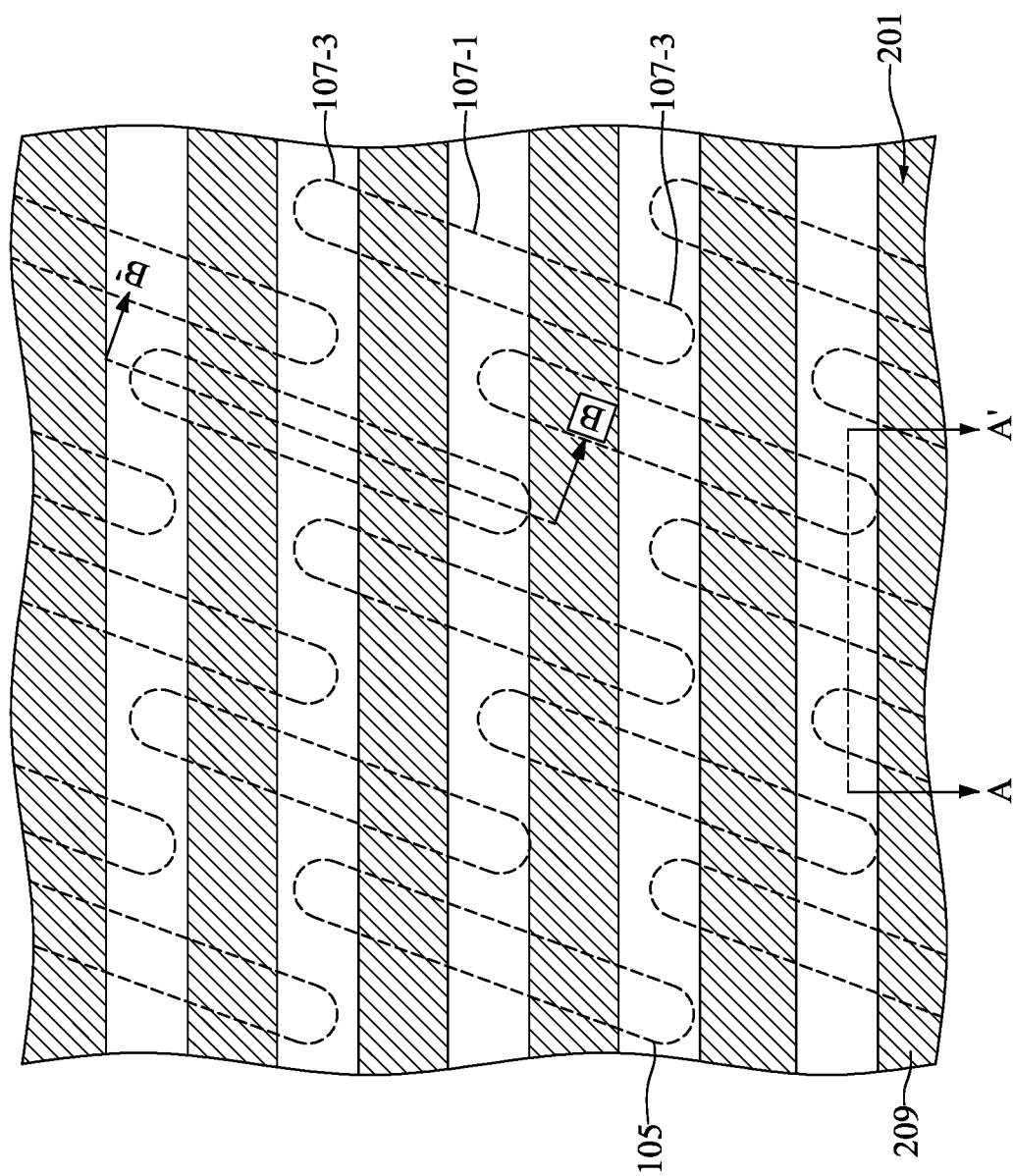
FIG. 7 illustrates, in a schematic top-view diagram, an intermediate semiconductor device in accordance with one embodiment of the present disclosure.
Figure 8:
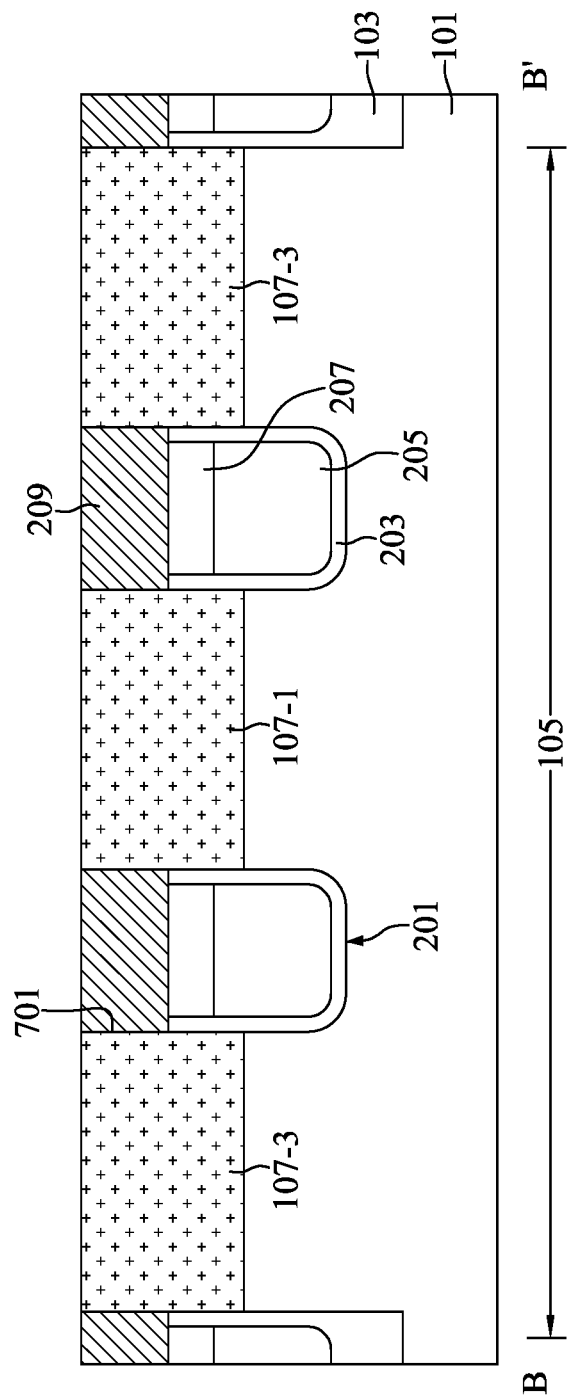
FIG. 8 is a schematic cross-sectional view diagram taken along the line B-B' in FIG. 7.

FIG. 5 illustrates, in a schematic top-view diagram, an intermediate semiconductor device in accordance with one embodiment of the present disclosure. FIG. 6 is a schematic cross-sectional view diagram taken along the line B-B' in FIG. 5 illustrating part of the flow for fabricating the semiconductor device 1A in accordance with one embodiment of the present disclosure. FIG. 7 illustrates, in a schematic top-view diagram, an intermediate semiconductor device in accordance with one embodiment of the present disclosure. FIG. 8 is a schematic cross-sectional view diagram taken along the line B-B' in FIG. 7 illustrating part of the flow for fabricating the semiconductor device 1A in accordance with one embodiment of the present disclosure.

With reference to FIG. 1 and FIGS. 5 to 8, at step S13, word line structures 201 may be formed in the substrate 101.

With reference to FIGS. 5 and 6, word line structure trenches 701 may be formed in the substrate 101. In a top-view perspective, the word line structure trenches 701 may extend along the first axis X and parallel to each other. The word line structure trenches 701 may be arranged along the second axis Y. Each of the active areas 105 may intersect with two of the word line structure trenches 701. The two of the word line structure trenches 701 may divide the corresponding active area 105 into three segments. In some embodiments, the bottom surfaces of the word line structure trenches 701 may be flat in a cross-sectional perspective. In some embodiments, the bottom surfaces of the word line structure trenches 701 may be rounded to reduce defect density and reduce electric field concentration during the operating of the semiconductor device 1A. Corner effects may be avoided if the word line structure trenches 701 have rounded bottom surfaces.

It should be noted that, in the present disclosure, the term "segment" may be interchangeably used with the term "portion."

With reference to FIGS. 7 and 8, word line dielectric layers 203 may be conformally formed in the word line structure trenches 701. The word line dielectric layers 203 may have U-shaped cross-sectional profiles. In some embodiments, the word line dielectric layers 203 may be formed by a thermal oxidation process. For example, the word line dielectric layers 203 may be formed by oxidizing the bottom surfaces and the sidewalls of the word line structure trenches 701.

In some embodiments, the word line dielectric layers 203 may be formed by a deposition process such as chemical vapor deposition or atomic layer deposition. The word line dielectric layers 203 may include a high-k material, an oxide such as silicon oxide, a nitride such as silicon nitride, an oxynitride such as silicon oxynitride, or a combination thereof. The high-k material may include a hafnium-containing material. The hafnium-containing material may be, for example, a hafnium oxide, a hafnium silicon oxide, a hafnium silicon oxynitride, or combinations thereof. In some embodiments, the high-k material may be, for example, a lanthanum oxide, a lanthanum aluminum oxide, a zirconium oxide, a zirconium silicon oxide, a zirconium silicon oxynitride, an aluminum oxide, and combinations thereof.

With reference to FIGS. 7 and 8, word line bottom conductive layers 205 may be respectively correspondingly formed on the word line dielectric layers 203 and in the word line structure trenches 701. Word line top conductive layers 207 may be respectively correspondingly formed on the word line bottom conductive layers 205 and in the word line structure trenches 701. The top surfaces of the word line top conductive layer 207 may be at a vertical level lower than the top surface of the substrate 101.

The word line bottom conductive layers 205 may be formed of, for example, polycrystalline silicon, polycrystalline germanium, polycrystalline silicon germanium, the like, or a combination thereof. In some embodiments, the word line bottom conductive layers 205 may be doped with a dopant such as phosphorus, arsenic, antimony, or boron. The word line top conductive layers 207 may be formed of, for example, tungsten, aluminum, titanium, copper, titanium nitride, the like, or a combination thereof.

With reference to FIGS. 7 and 8, the word line capping layers 209 may be respectively correspondingly formed on the word line top conductive layers 207. The top surfaces of the word line capping layer 209 may be substantially coplanar with the top surface of the substrate 101. The word line capping layers 209 may be formed of, for example, silicon oxide, silicon nitride, silicon oxynitride, other semiconductor oxides, other semiconductor nitrides, or a combination thereof.

With reference to FIGS. 7 and 8, the word line dielectric layers 203, the word line bottom conductive layers 205, the word line top conductive layers 207, and the word line capping layers 209 together form the word line structures 201. In a top-view perspective, the word line structures 201 may extend along the first axis X and parallel to each other. The word line structures 201 may be arranged along the second axis Y. Each of the active areas 105 may intersect with two of the word line structures 201.

With reference to FIGS. 7 and 8, an implantation process may be performed over the substrate 101. After implantation process, the source/drain regions 107-1, 107-3 may be formed in upper portions of the active areas 105 in a cross-sectional perspective. In a top-view perspective, for each of the active areas 105, the source region 107-1 may be formed between the two of the word line structures 201 intersected with the active area 105. The drain regions 107-3 may be formed at two ends of the active area 105. The source/drain regions 107-1, 107-3 may be doped with a dopant such as phosphorus, arsenic, antimony, or boron.

Figure 9:
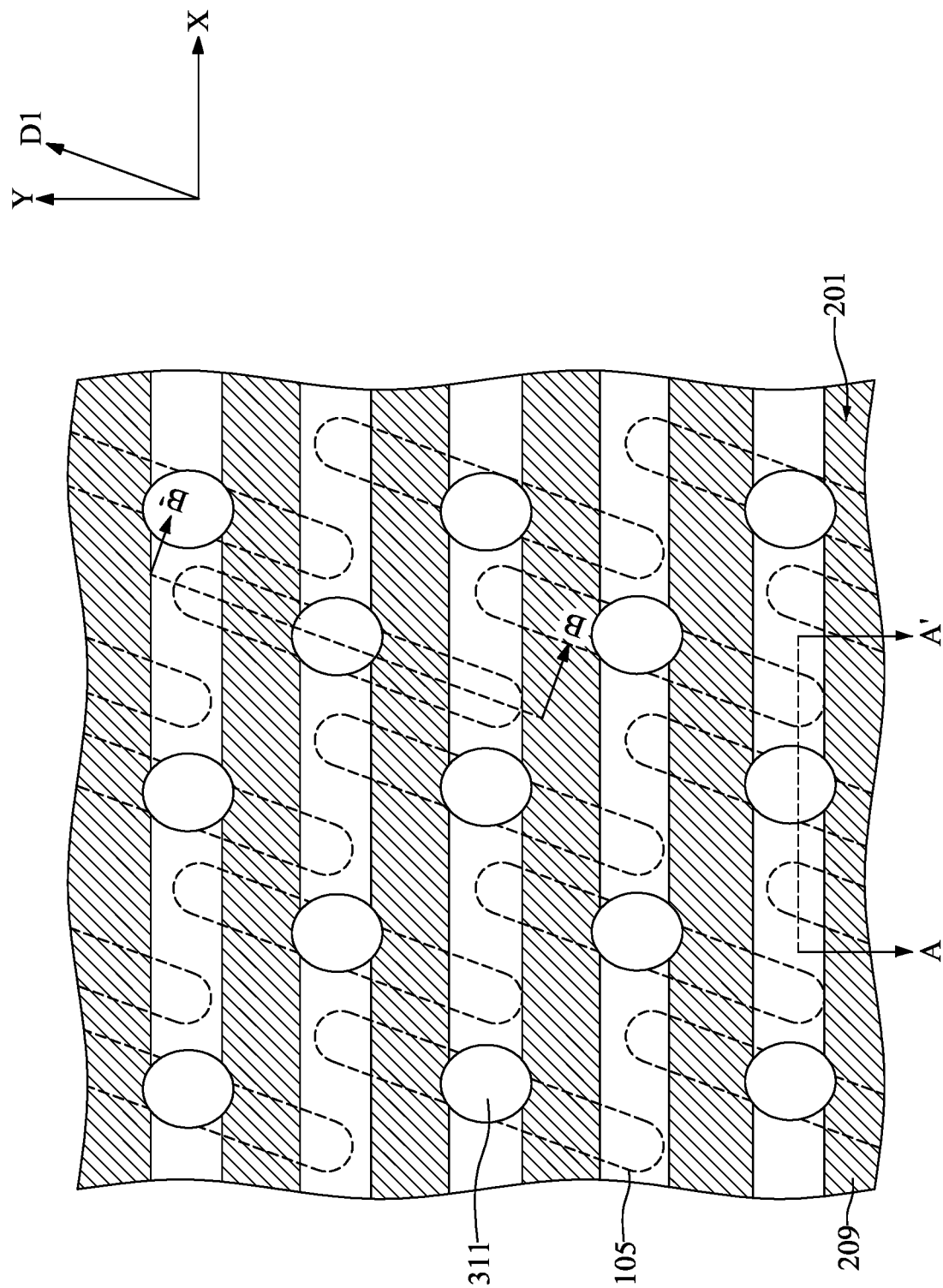
FIG. 9 illustrates, in a schematic top-view diagram, an intermediate semiconductor device in accordance with one embodiment of the present disclosure.
Figure 10:
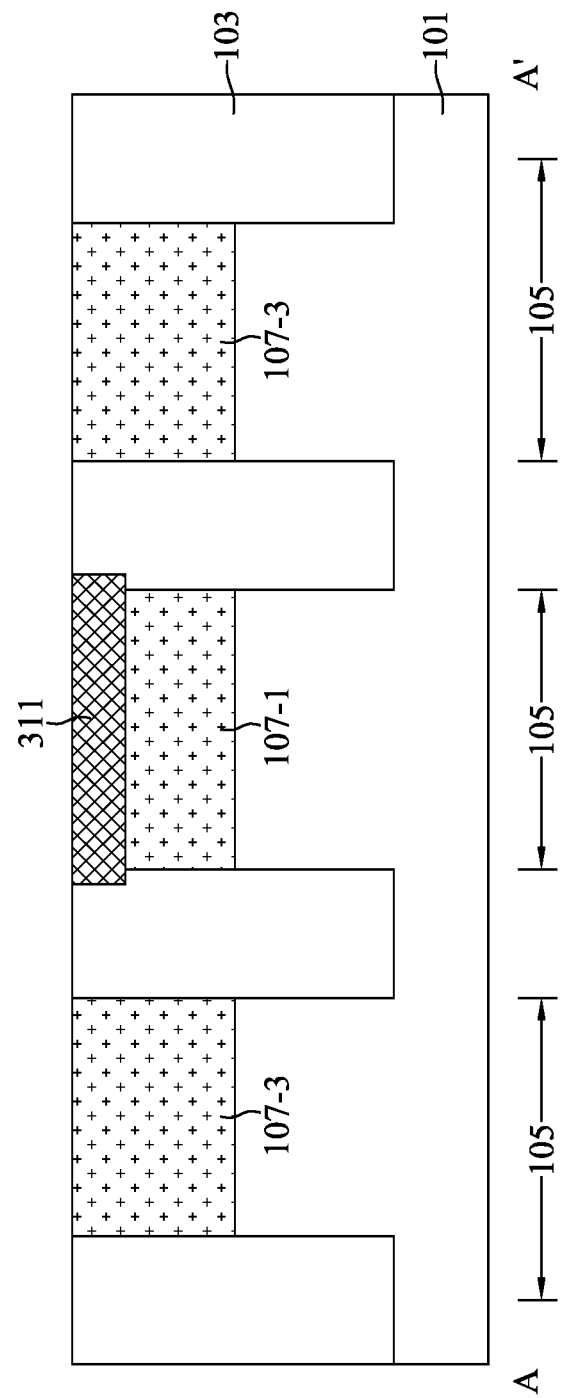
FIGS. 10 and 11 are schematic cross-sectional view diagrams respectively taken along the line A-A' and the line B-B' in FIG. 9
Figure 11:
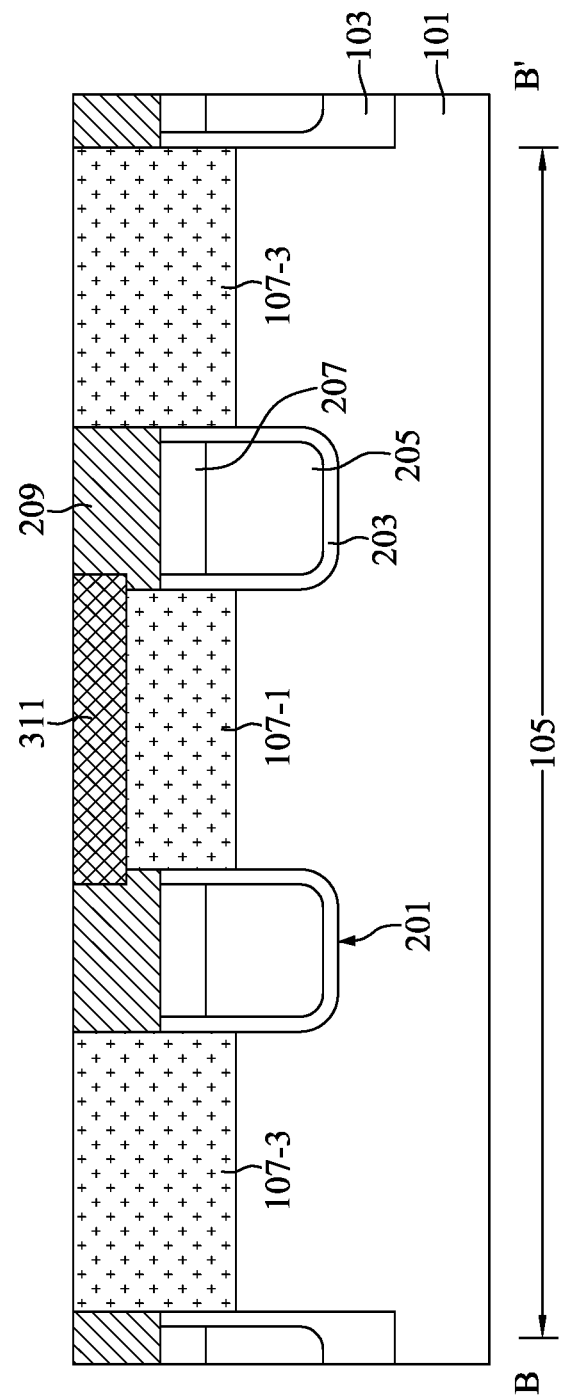
Figure 12:
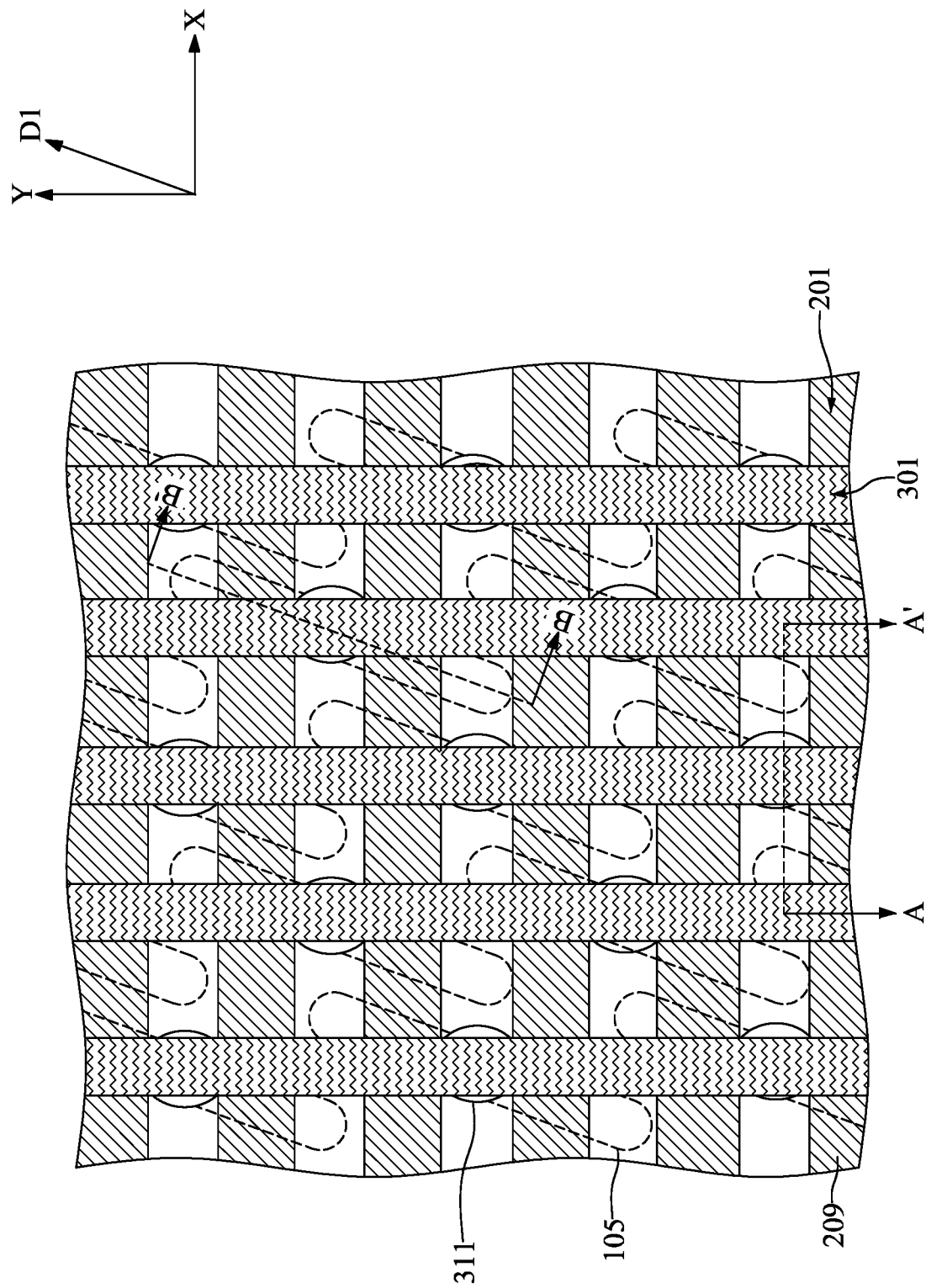
FIG. 12 illustrates, in a schematic top-view diagram, an intermediate semiconductor device in accordance with one embodiment of the present disclosure.
Figure 13:
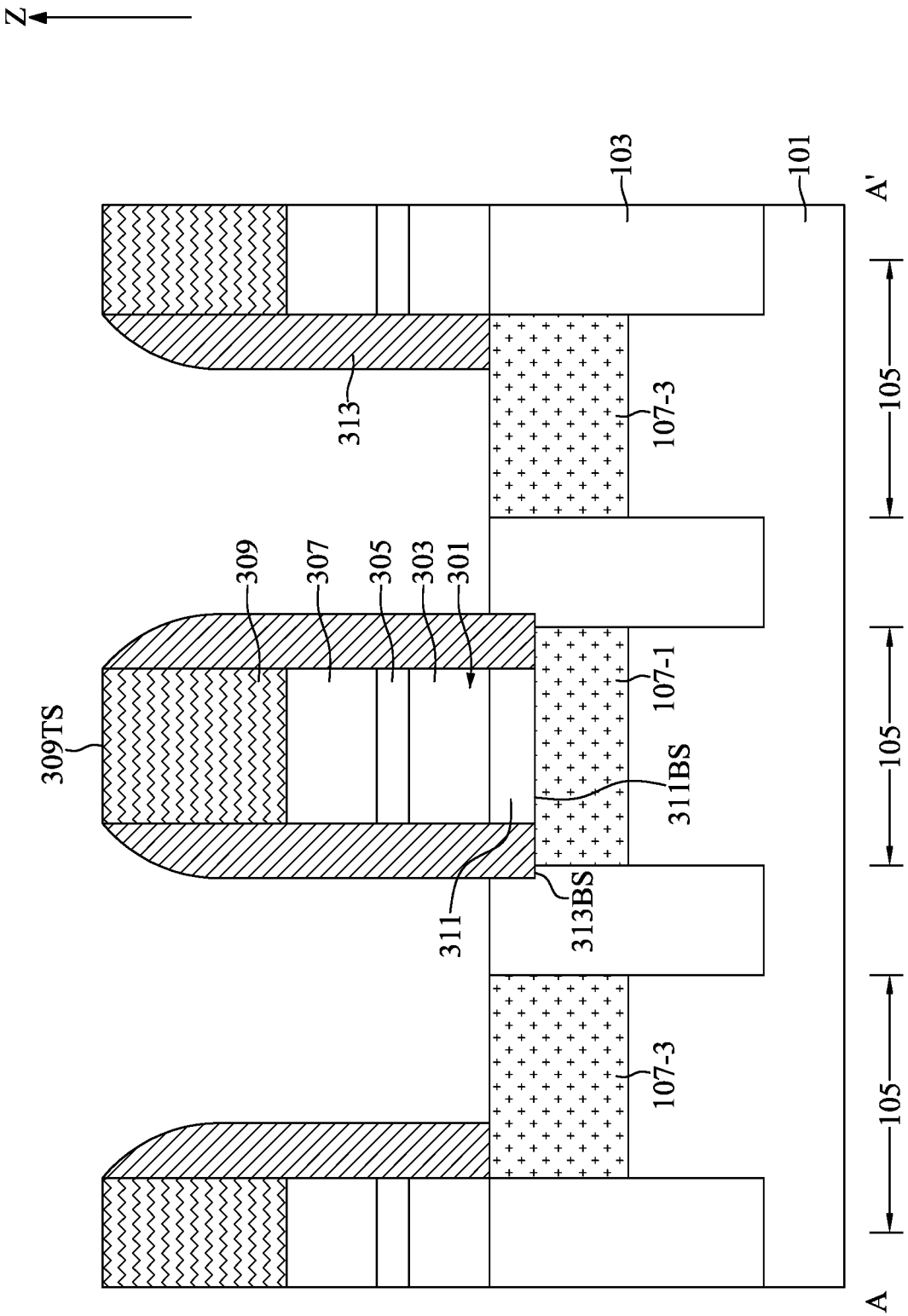
FIGS. 13 and 14 are schematic cross-sectional view diagrams respectively taken along the line A-A' and the line B-B' in FIG. 12.
Figure 14:
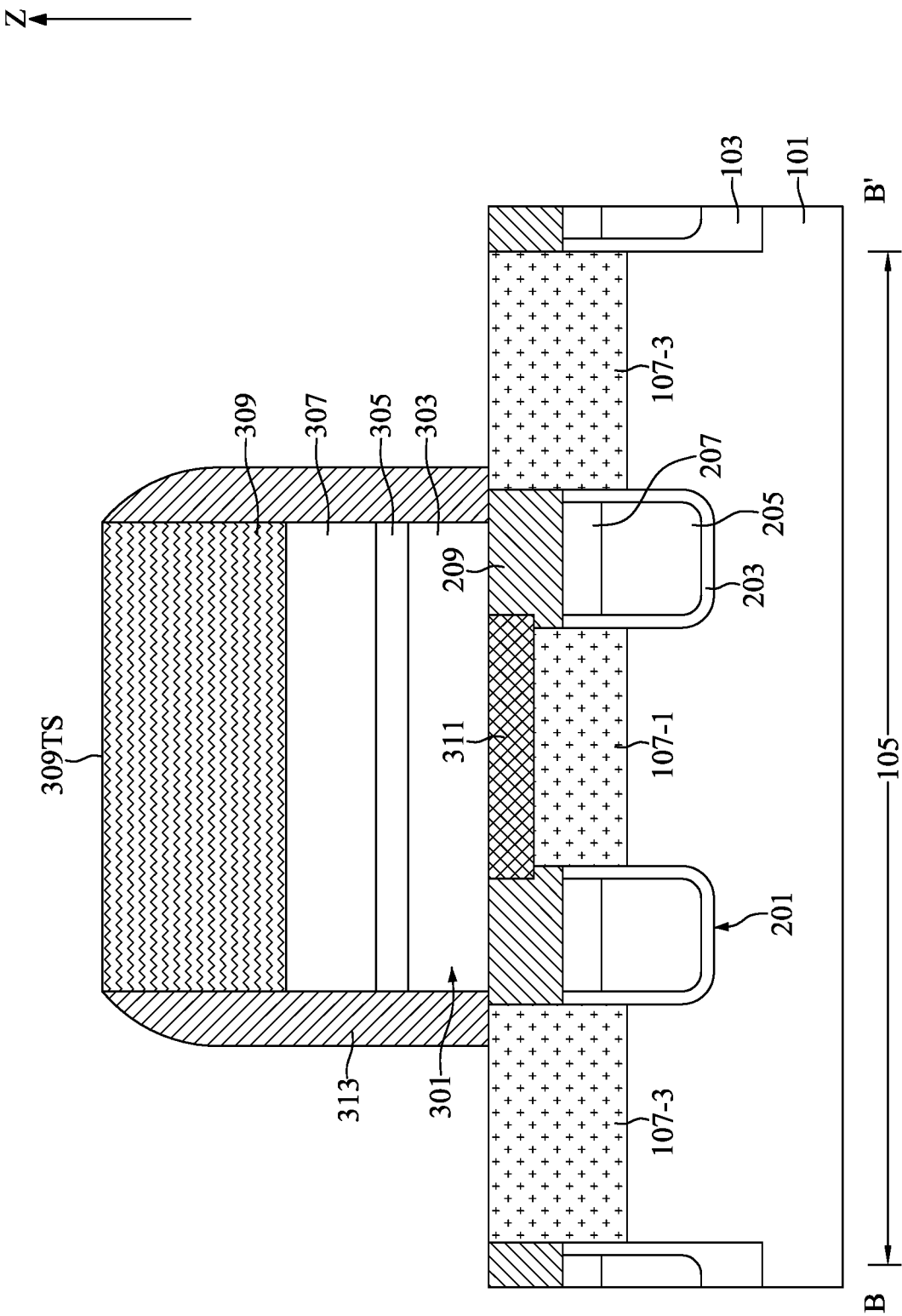
Figure 15:
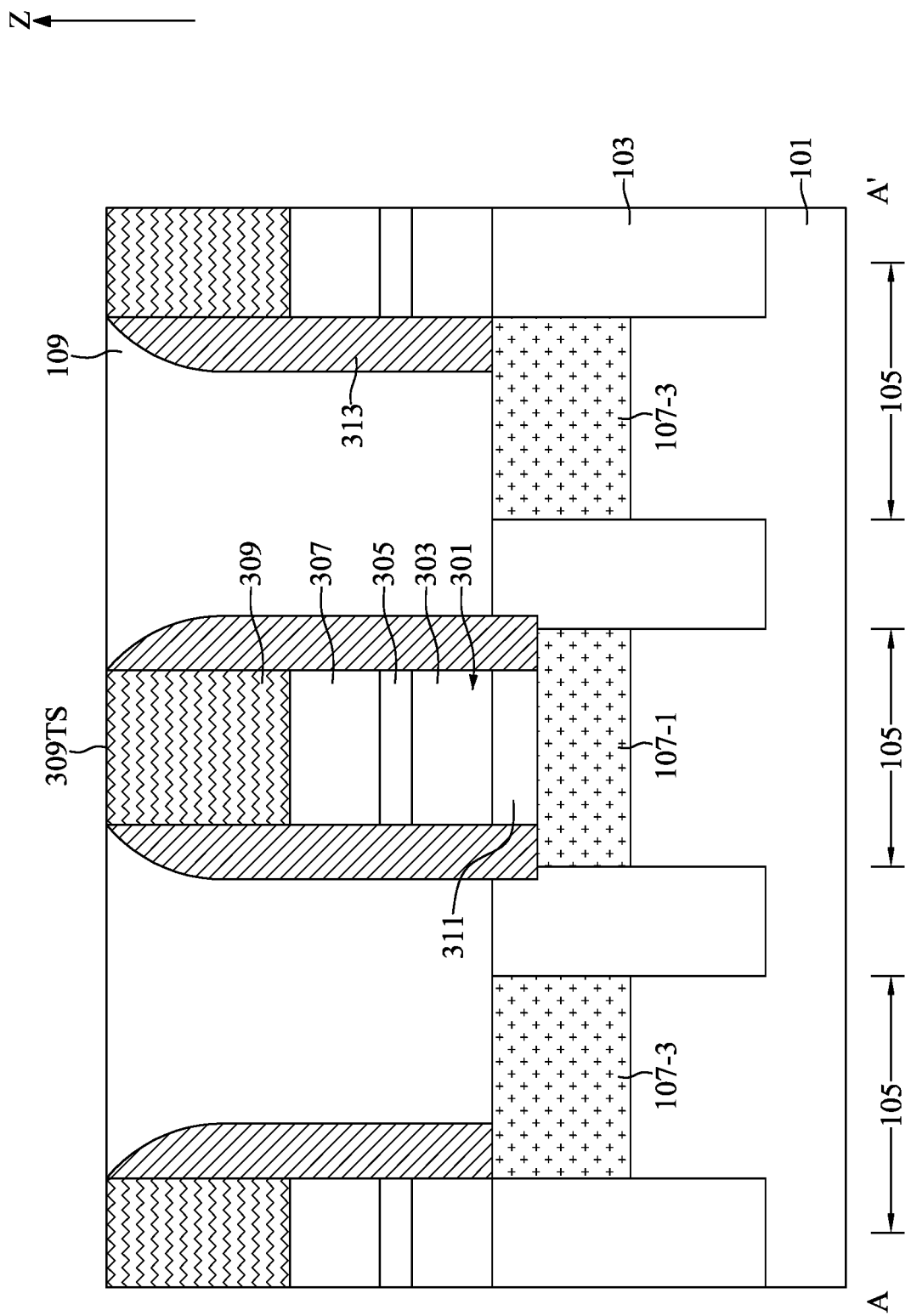
FIGS. 15 and 16 are schematic cross-sectional view diagrams respectively taken along the line A-A' and the line B-B' in FIG. 12.
Figure 16:
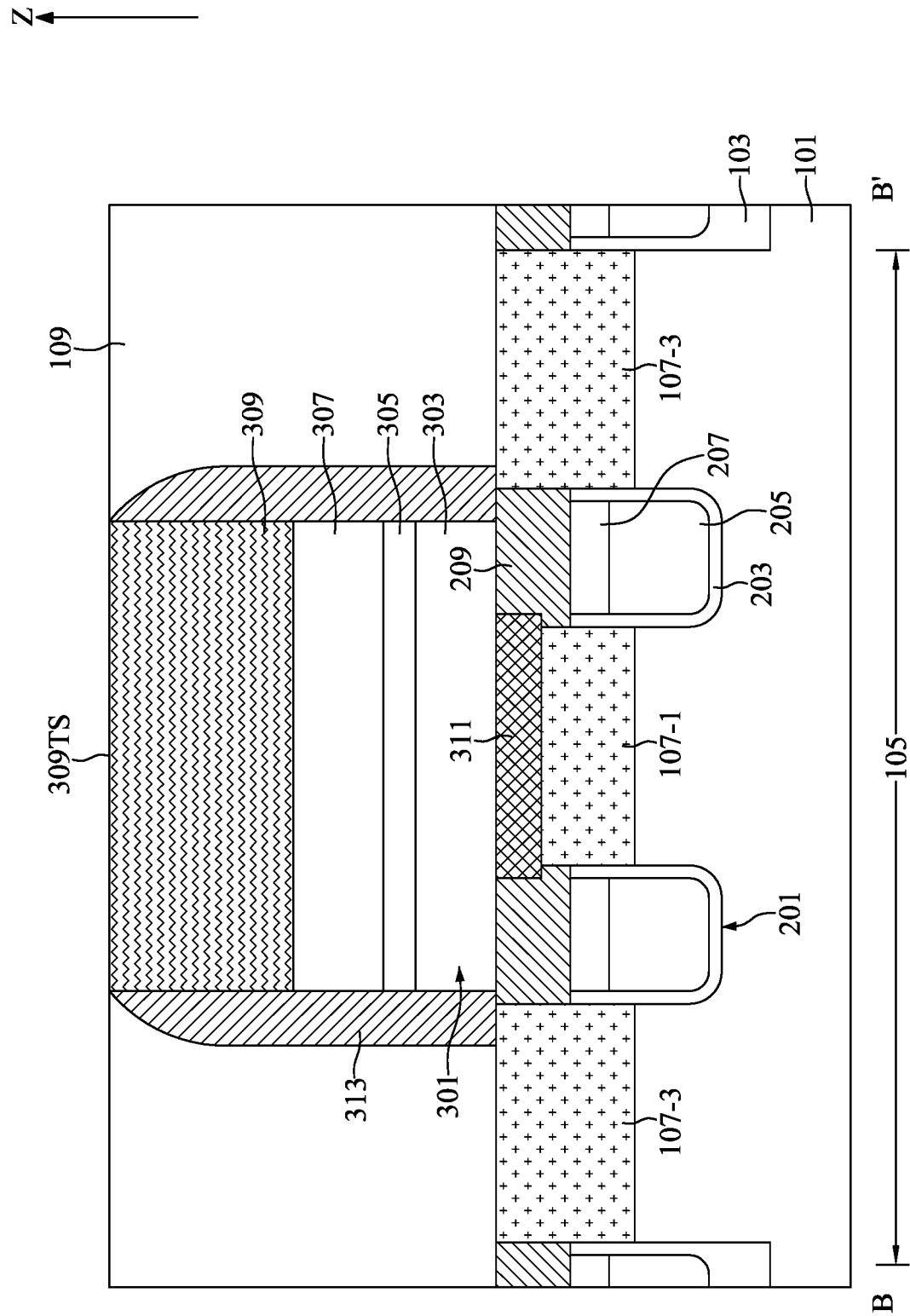

FIG. 9 illustrates, in a schematic top-view diagram, an intermediate semiconductor device in accordance with one embodiment of the present disclosure. FIGS. 10 and 11 are schematic cross-sectional view diagrams respectively taken along the line A-A' and the line B-B' in FIG. 9 illustrating part of the flow for fabricating the semiconductor device 1A in accordance with one embodiment of the present disclosure. FIG. 12 illustrates, in a schematic top-view diagram, an intermediate semiconductor device in accordance with one embodiment of the present disclosure. FIGS. 13 and 14 are schematic cross-sectional view diagrams respectively taken along the line A-A' and the line B-B' in FIG. 12 illustrating part of the flow for fabricating the semiconductor device 1A in accordance with one embodiment of the present disclosure. FIGS. 15 and 16 are schematic cross-sectional view diagrams respectively taken along the line A-A' and the line B-B' in FIG. 12 illustrating part of the flow for fabricating the semiconductor device 1A in accordance with one embodiment of the present disclosure.

With reference to FIG. 1 and FIGS. 9 to 16, at step S15, bit line contacts 311 may be formed in the substrate 101 and bit line structures 301 and bit line spacers 313 may be formed on the substrate 101.

With reference to FIGS. 9 to 11, the bit line contacts 311 may be respectively correspondingly formed in the source regions 107-1. The top surfaces of the bit line contacts 311 may be substantially coplanar with the top surface of the substrate 101. The bit line contacts 311 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The bit line contacts 311 may electrically couple to the source regions 107-1.

With reference to FIGS. 12 to 14, a series of deposition processes may be sequentially performed to deposit a bit line bottom conductive layer 303, a bit line middle conductive layer 305, a bit line top conductive layer 307, and a bit line capping layer 309 over the substrate 101. Subsequently, a photolithography process and an etch process may be applied to pattern the aforementioned layers. The patterned aforementioned layers may together form the bit line structures 301.

In a cross-sectional perspective, the bit line structures 301 may be formed on the bit line contacts 311. The top surfaces 309TS of the bit line capping layers 309 may be referred to as the top surfaces of the bit line structures 301. In some embodiments, portions of the bit line contacts 311 may be removed during the etch process as shown in FIG. 13. In a top-view perspective, the bit line structures 301 may extend along the second axis Y and parallel to each other. The bit line structures 301 may be arranged along the first axis X. That is, the bit line structures 301 may intersect with the word line structures 201. The bit line structures 301 may be electrically coupled to the source regions 107-1 through the bit line contacts 311.

The bit line bottom conductive layers 303 may be formed of, for example, polycrystalline silicon, polycrystalline germanium, polycrystalline silicon germanium, titanium, tantalum, tungsten, copper, aluminum, tungsten silicide, cobalt silicide, or titanium silicide. The bit line middle conductive layers 305 may be formed of, for example, titanium nitride or tantalum nitride. The bit line top conductive layers 307 may be formed of, for example, tungsten, tantalum, titanium, copper, or aluminum. The bit line middle conductive layers 305 may reduce or possibly prevent the conductive material in the bit line top conductive layers 307 from diffusing toward the bit line bottom conductive layers 303. The bit line capping layer 309 may be formed of, for example, silicon nitride, silicon nitride oxide, silicon oxynitride, boron nitride, silicon boron nitride, phosphorus boron nitride, or boron carbon silicon nitride.

With reference to FIGS. 12 to 14, a layer of spacer material may be formed to cover the bit line structures 301 and the substrate 101. The spacer material may be, for example, silicon oxide, silicon nitride, silicon carbon nitride, silicon nitride oxide, or silicon oxynitride. An etch process, such as an anisotropic dry etch process, may be performed to remove portions of the layer of spacer material and concurrently form the bit line spacers 313 attached on sidewalls of the bit line structures 301. In some embodiments, some portions of the bottom surface 313BS of the bit line spacers 313 may be substantially coplanar with the bottom surfaces 311BS of the bit line contacts 311 as shown in FIG. 13.

In some embodiments, an interlayer may be formed on the substrate 101 after the formation of the bit line contacts 311. The bit line structures 301 may be formed on the interlayer. The interlayer may be formed of, for example, carbon-doped oxide, carbon incorporated silicon oxide, or nitrogen-doped silicon carbide.

With reference to FIGS. 15 and 16, a first dielectric layer 109 may be formed to cover the substrate 101 and the bit line structures 301. A planarization process, such as chemical mechanical polishing, may be performed until the top surfaces 309TS of the bit line capping layers 309 are exposed to remove excess material and provide a substantially flat surface for subsequent processing steps. The first dielectric layer 109 may be formed of, for example, silicon oxide, undoped silicate glass, fluorosilicate glass, borophosphosilicate glass, a low-k dielectric material, or a combination thereof. The low-k dielectric materials may have a dielectric constant less than 3.0 or even less than 2.5. In some embodiments, the low-k dielectric materials may have a dielectric constant less than 2.0.

Figure 17:
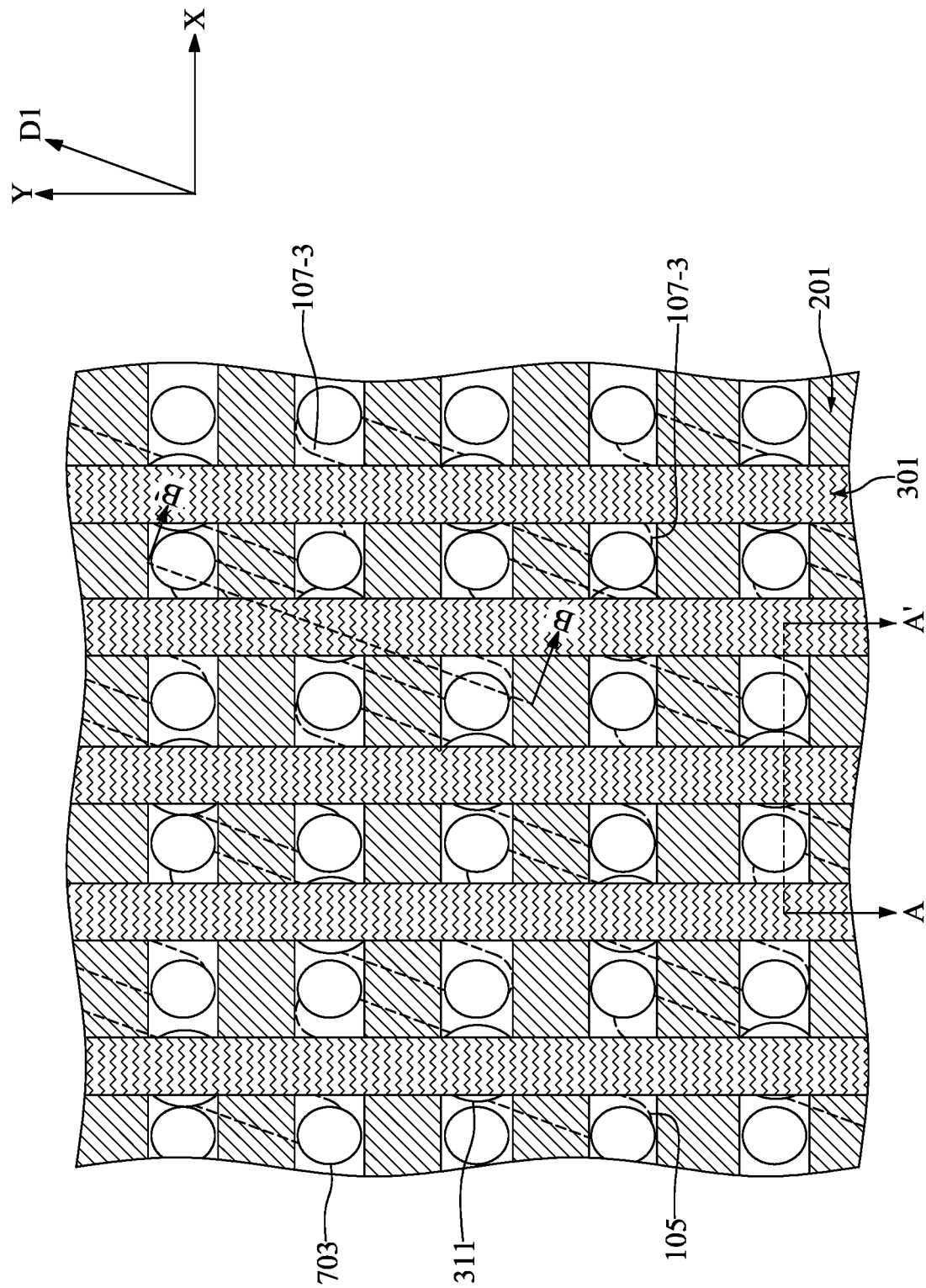
FIG. 17 illustrates, in a schematic top-view diagram, an intermediate semiconductor device in accordance with one embodiment of the present disclosure.
Figure 18:
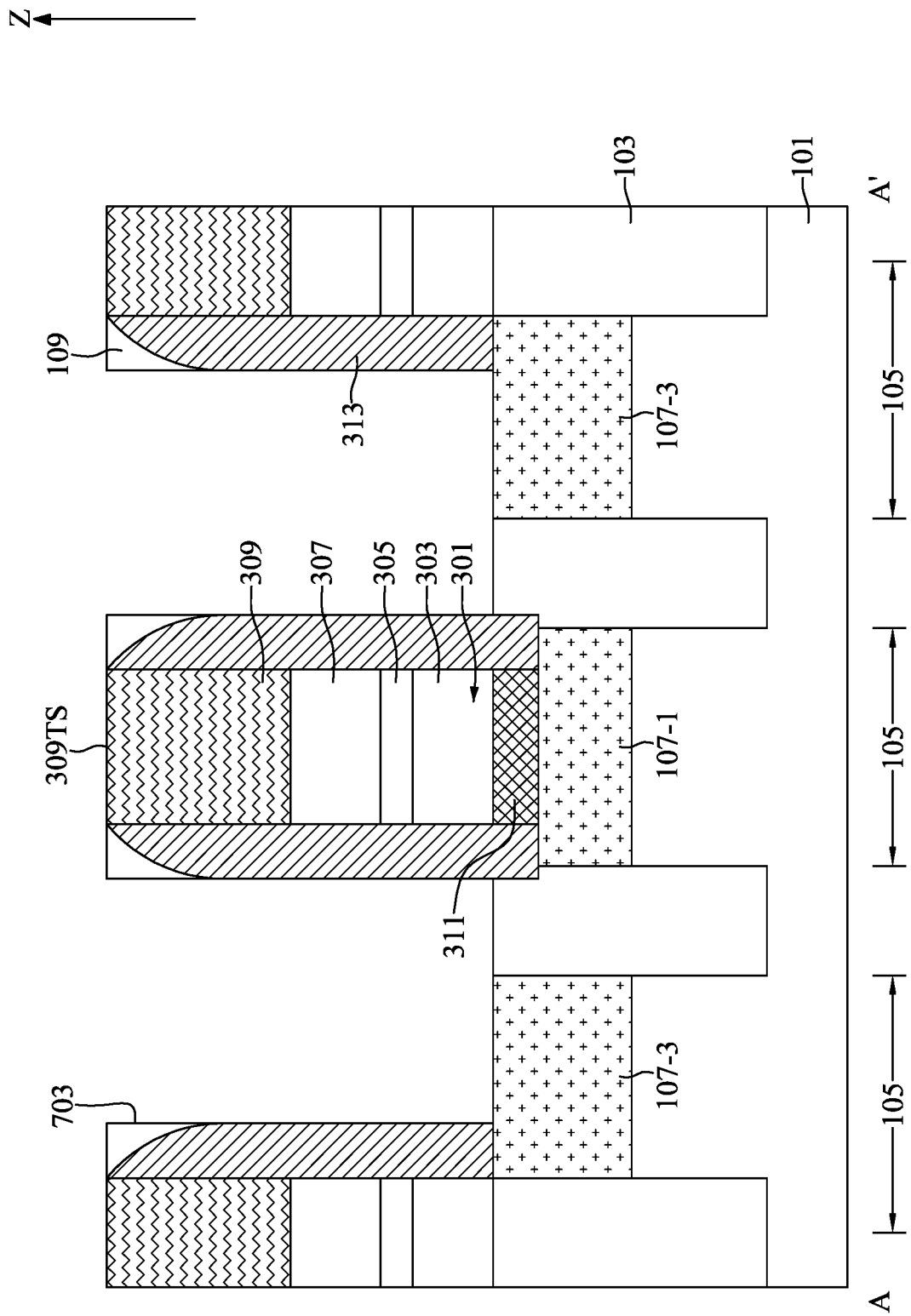
FIGS. 18 and 19 are schematic cross-sectional view diagrams respectively taken along the line A-A' and the line B-B' in FIG. 17.
Figure 19:
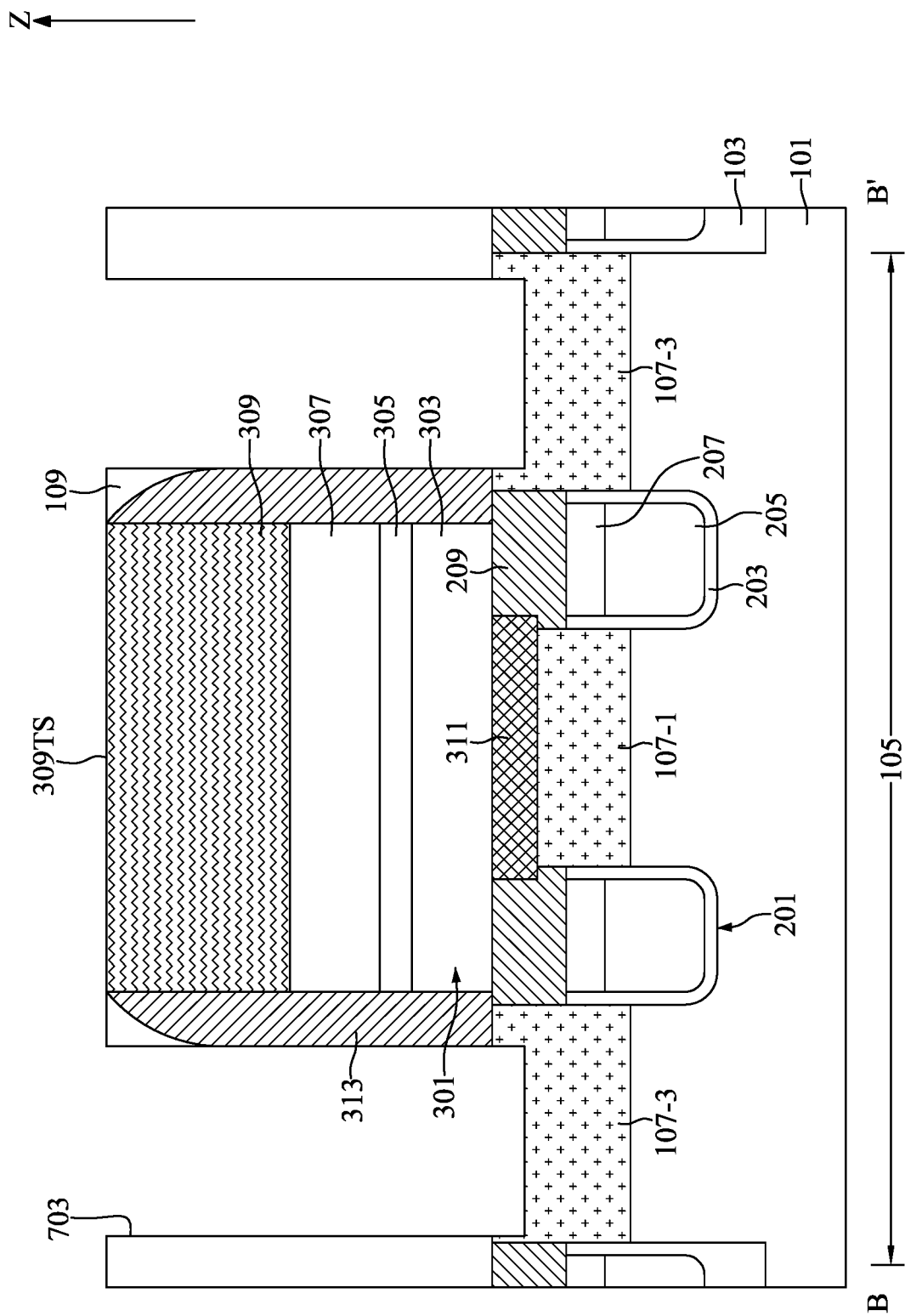

FIG. 17 illustrates, in a schematic top-view diagram, an intermediate semiconductor device in accordance with one embodiment of the present disclosure. FIGS. 18 and 19 are schematic cross-sectional view diagrams respectively taken along the line A-A' and the line B-B' in FIG. 17 illustrating part of the flow for fabricating the semiconductor device 1A in accordance with one embodiment of the present disclosure.

With reference to FIG. 1 and FIGS. 17 to 19, at step S17, capacitor contact openings 703 may be formed extended to the substrate 101.

With reference to FIGS. 17 to 19, a photolithography process and a following etch process may be performed to form the capacitor contact openings 703 along the first dielectric layer 109 and extended to the upper portions of the substrate 101. Portions of the drain regions 107-3 may be exposed through the capacitor contact openings 703. In a top-view perspective, the capacitor contact openings 703 may be located on the ends of the active areas 105.

Figure 20:
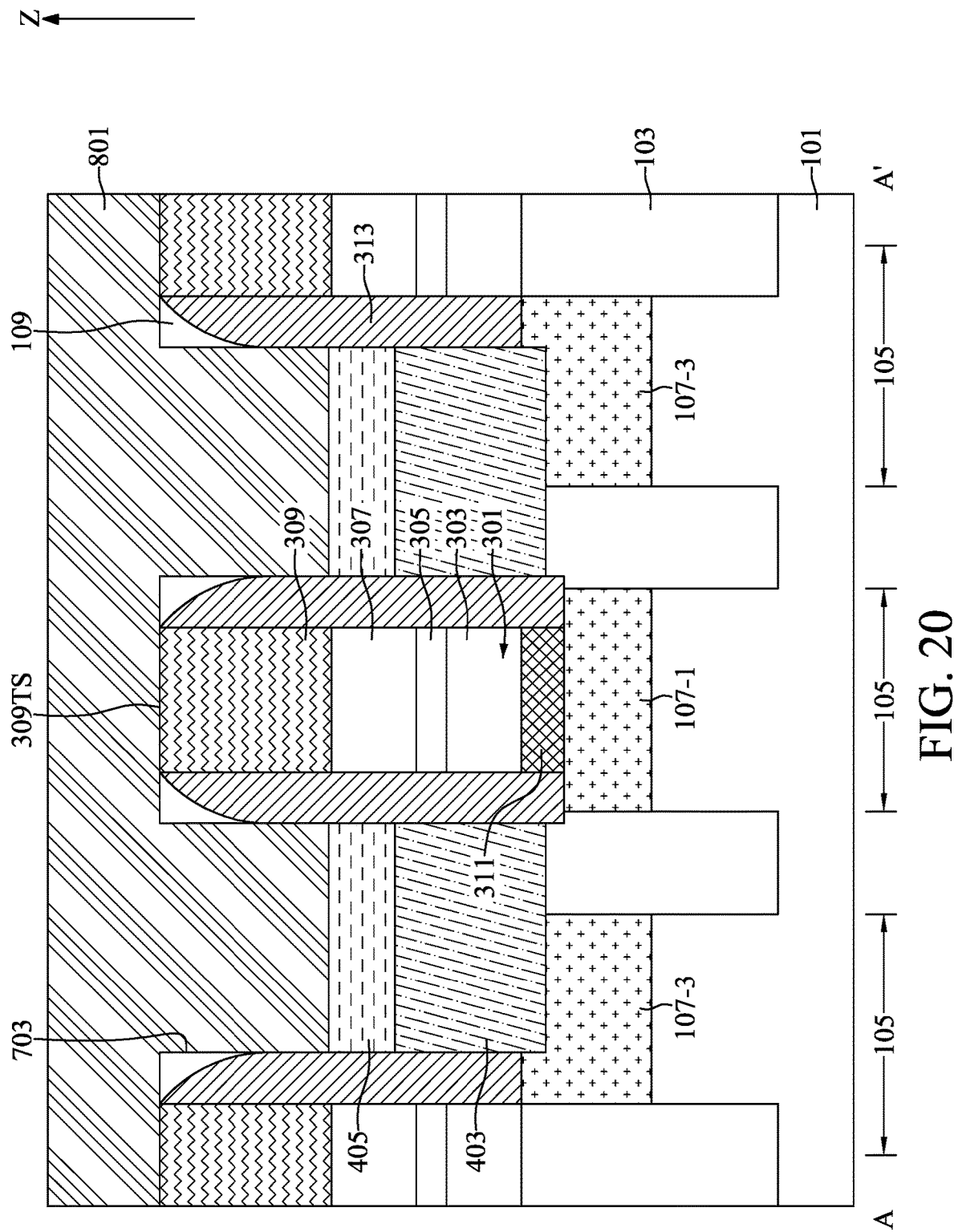
FIGS. 20 and 21 are schematic cross-sectional view diagrams respectively taken along the line A-A' and the line B-B' in FIG. 17.
Figure 21:
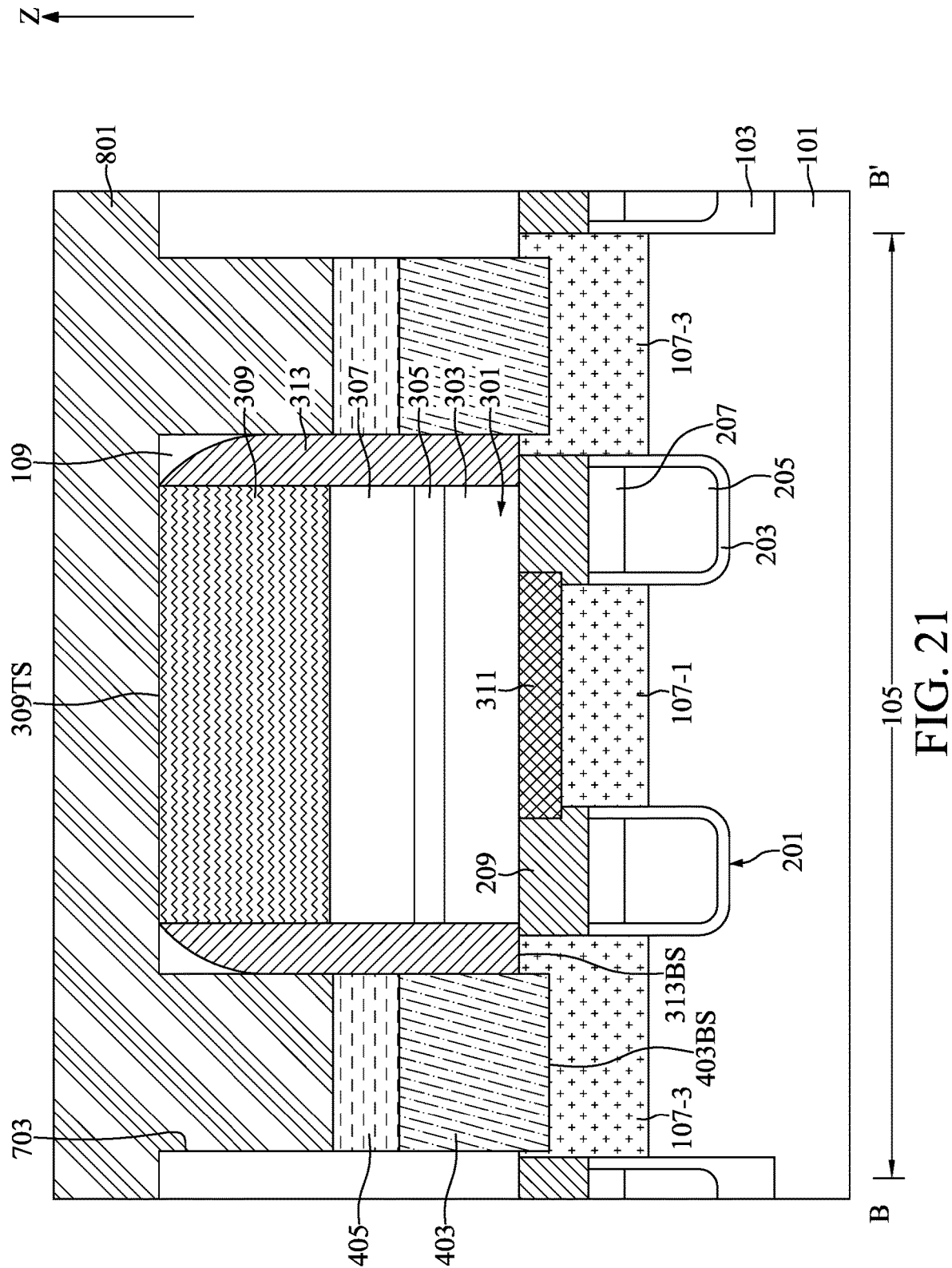
Figure 22:
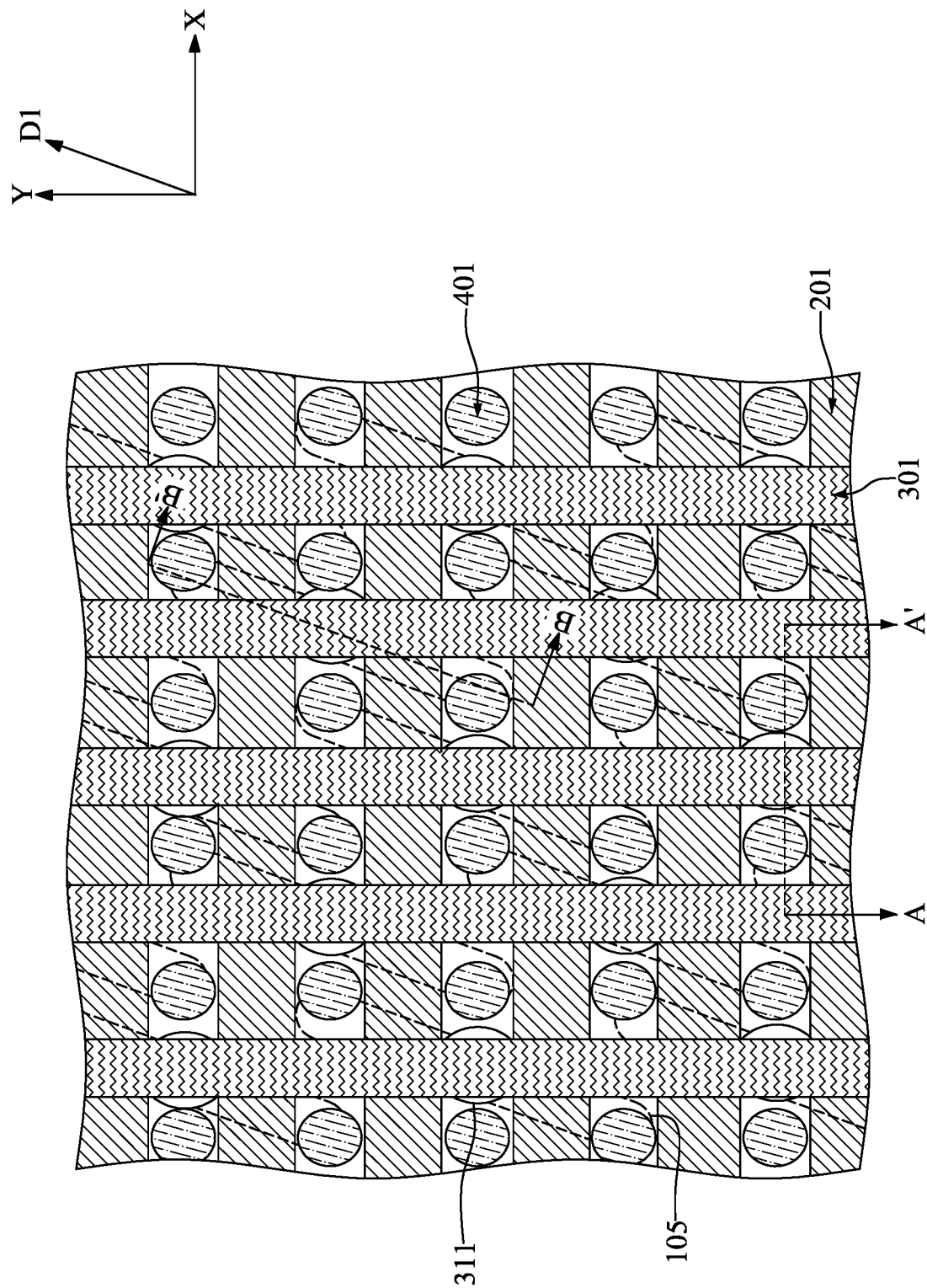
FIG. 22 illustrates, in a schematic top-view diagram, an intermediate semiconductor device in accordance with one embodiment of the present disclosure.
Figure 23:
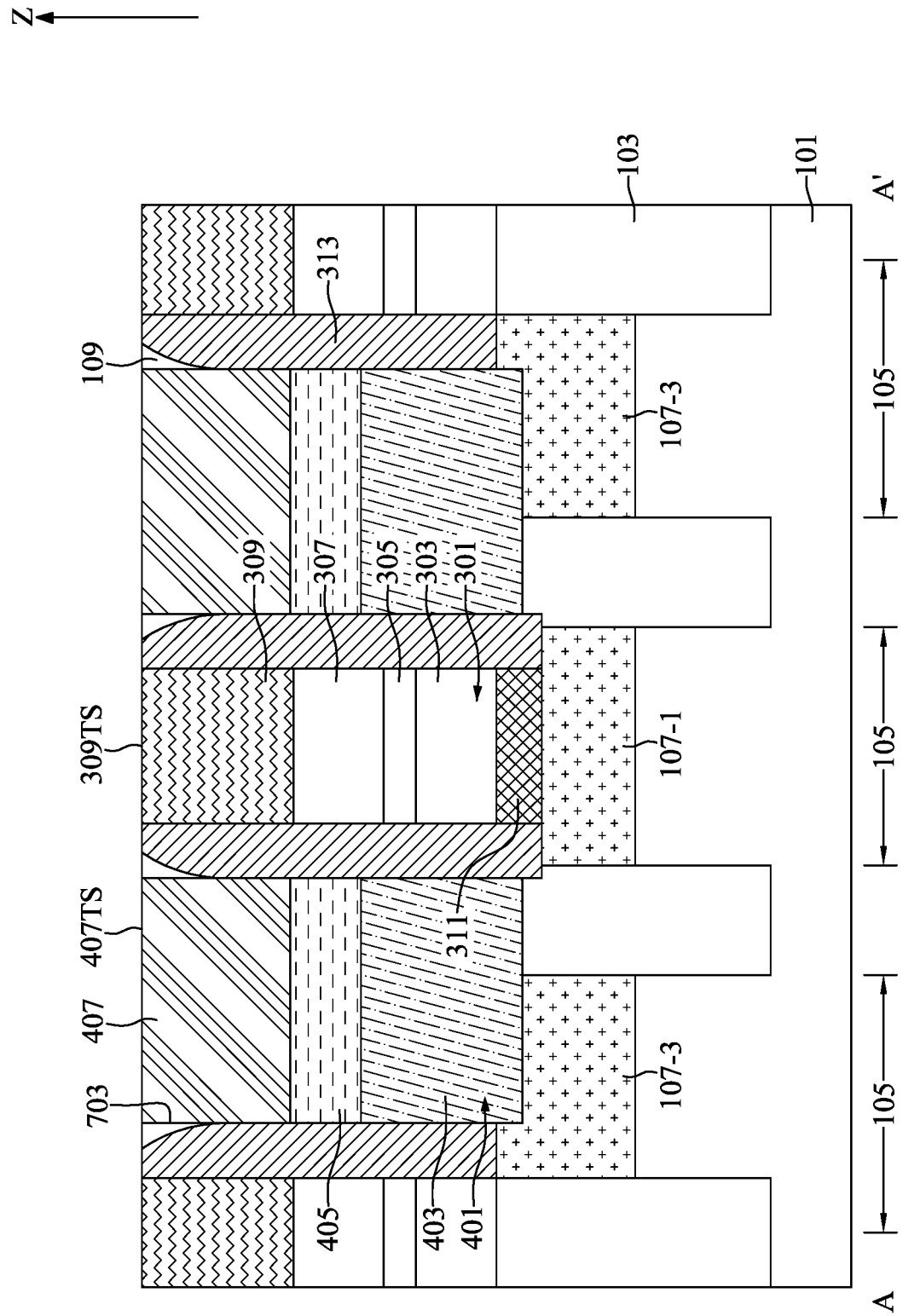
FIGS. 23 and 24 are schematic cross-sectional view diagrams respectively taken along the line A-A' and the line B-B' in FIG. 22.
Figure 24:
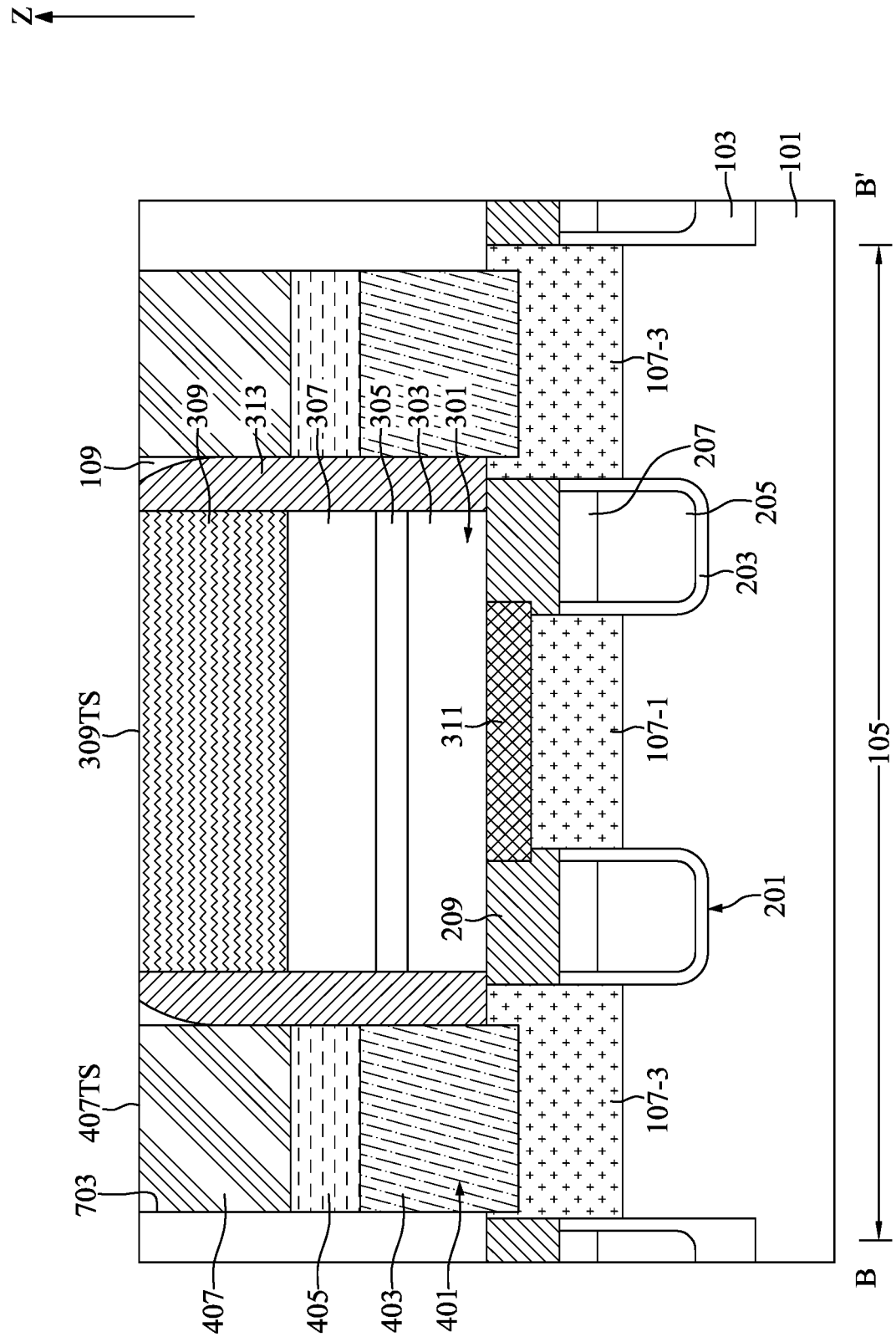

FIGS. 20 and 21 are schematic cross-sectional view diagrams respectively taken along the line A-A' and the line B-B' in FIG. 17 illustrating part of the flow for fabricating the semiconductor device 1A in accordance with one embodiment of the present disclosure. FIG. 22 illustrates, in a schematic top-view diagram, an intermediate semiconductor device in accordance with one embodiment of the present disclosure. FIGS. 23 and 24 are schematic cross-sectional view diagrams respectively taken along the line A-A' and the line B-B' in FIG. 22 illustrating part of the flow for fabricating the semiconductor device 1A in accordance with one embodiment of the present disclosure.

With reference to FIG. 1 and FIGS. 20 to 24, at step S19, capacitor contact structures 401 may be formed in the capacitor contact openings 703.

With reference to FIGS. 20 and 21, capacitor contact bottom conductive layers 403 may be respectively correspondingly formed in the capacitor contact openings 703. In some embodiments, as shown in FIG. 21, the bottom surfaces 403BS of the capacitor contact bottom conductive layers 403 may be at a vertical level lower than a vertical level of the bottom surfaces 313BS of the bit line spacers 313. The capacitor contact bottom conductive layers 403 may be formed of, for example, polycrystalline silicon, polycrystalline germanium, or polycrystalline silicon germanium. In some embodiments, the capacitor contact bottom conductive layers 403 may be doped with a dopant such as phosphorus, arsenic, antimony, or boron. The capacitor contact middle conductive layers 405 may be formed on the capacitor contact bottom conductive layers 403 and in the capacitor contact openings 703. The capacitor contact middle conductive layers 405 may be formed of, for example, cobalt silicide, titanium silicide, nickel silicide, nickel platinum silicide, or tantalum silicide. The top surfaces of the capacitor contact middle conductive layers 405 may be at a vertical level lower than a vertical level of the top surfaces 309TS of the bit line capping layers 309.

A layer of first conductive material 801 may be formed to completely fill the capacitor contact openings 703 and cover the first dielectric layer 109 and the bit line capping layers 309. The first conductive material 801 may be, for example, titanium nitride or tantalum nitride. The capacitor contact middle conductive layers 405 may reduce the contact resistance between the layer of first conductive material 801 and the capacitor contact bottom conductive layers 403.

With reference to FIGS. 22 to 24, a planarization process, such as chemical mechanical polishing, may be performed until the top surfaces of the bit line capping layers 309 are exposed to remove excess material, provide a substantially flat surface for subsequent processing steps, and concurrently form capacitor contact top conductive layers 407 on the capacitor contact middle conductive layers 405. In the current stage, the top surfaces 407TS of capacitor contact top conductive layers 407 may be substantially coplanar with the top surfaces 309TS of the bit line capping layers 309.

The capacitor contact bottom conductive layers 403, the capacitor contact middle conductive layers 405, and the capacitor contact top conductive layers 407 may together form the capacitor contact structures 401. The top surfaces 407TS of the capacitor contact top conductive layers 407 may be referred to as the top surfaces of the capacitor contact structures 401. The capacitor contact structures 401 may be electrically coupled to the drain regions 107-3.

Figure 25:
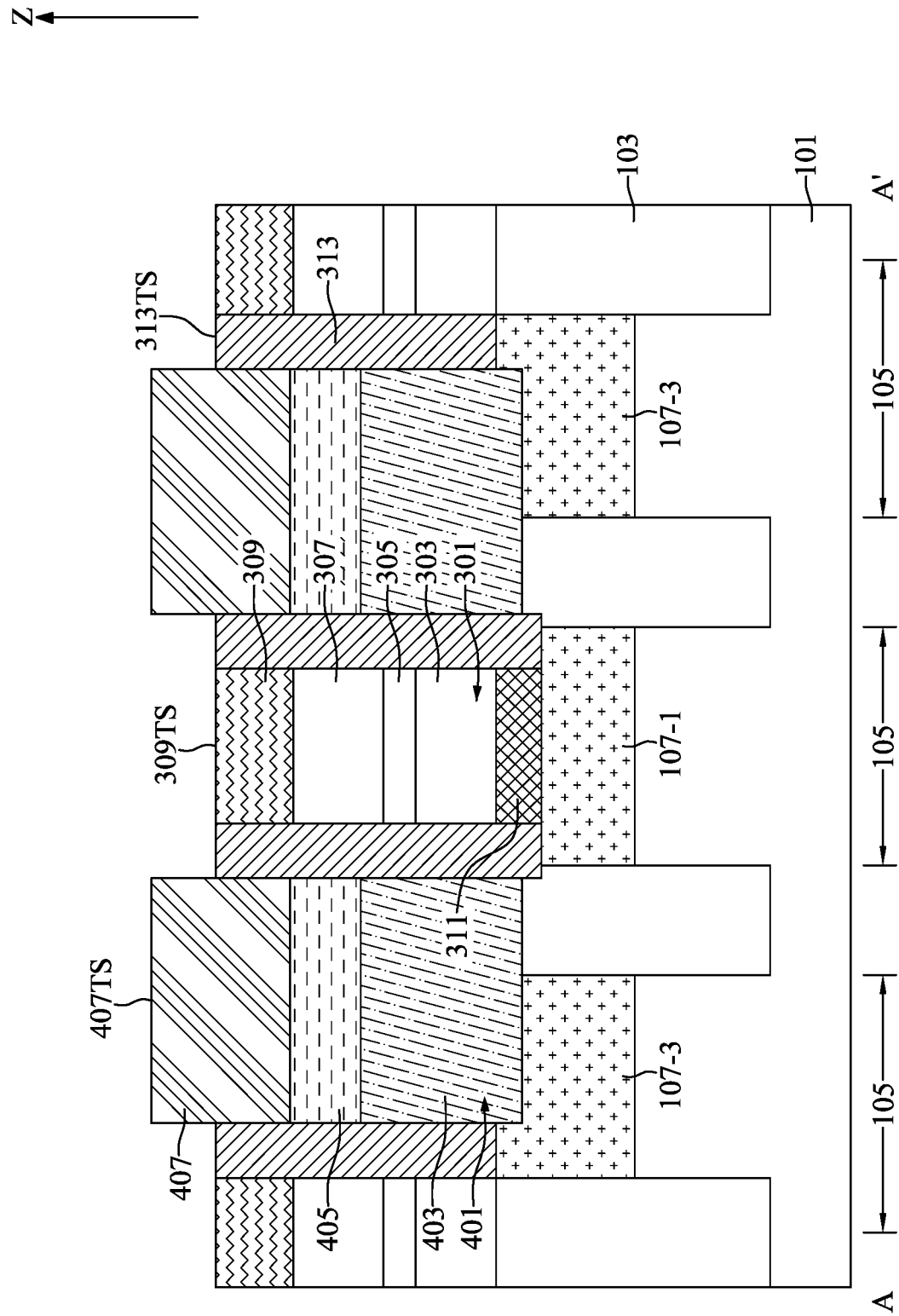
FIGS. 25 and 26 are schematic cross-sectional view diagrams respectively taken along the line A-A' and the line B-B' in FIG. 22.
Figure 26:
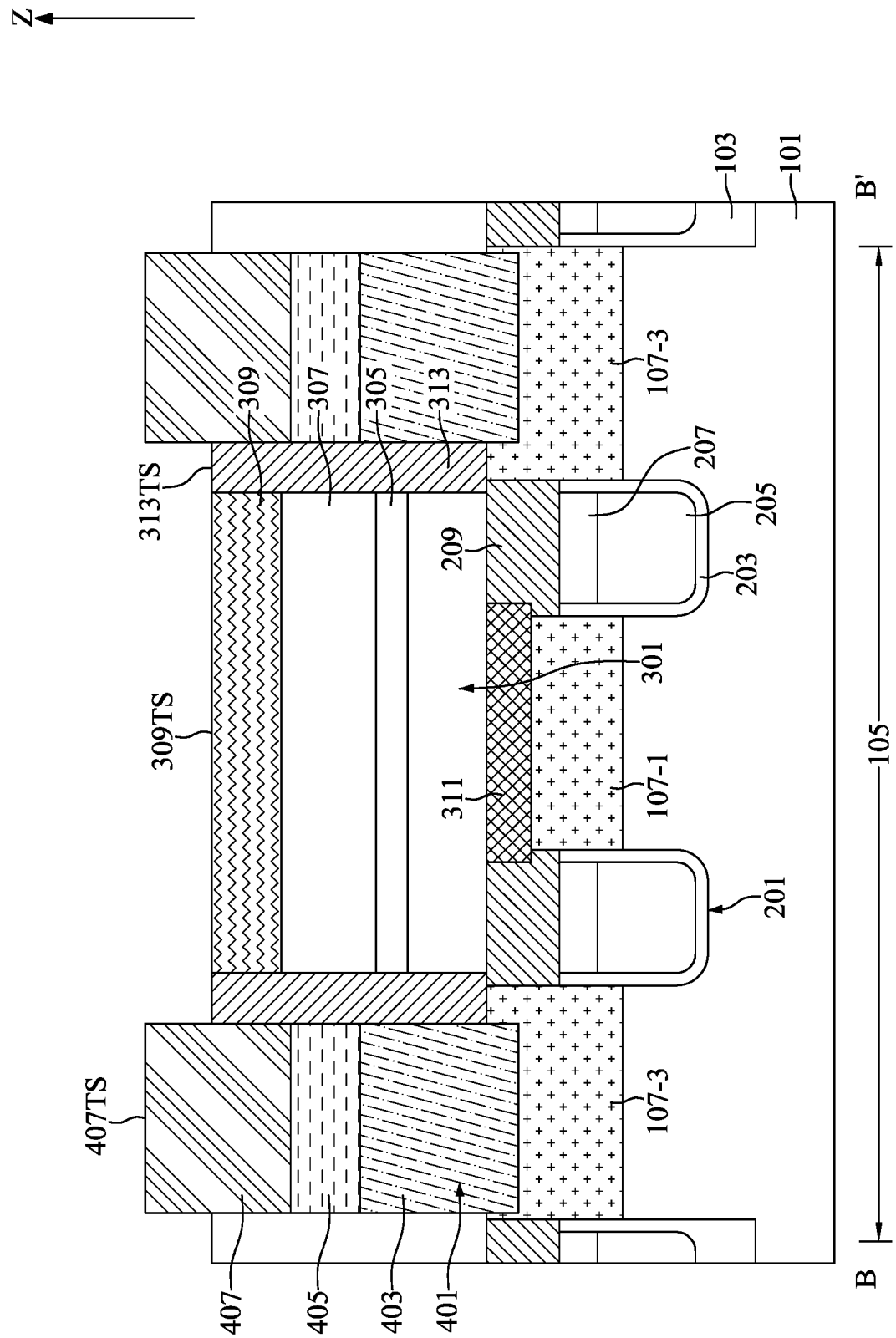

FIGS. 25 and 26 are schematic cross-sectional view diagrams respectively taken along the line A-A' and the line B-B' in FIG. 22 illustrating part of the flow for fabricating the semiconductor device 1A in accordance with one embodiment of the present disclosure.

With reference to FIGS. 1, 25, and 26, at step S21, the top surfaces of the bit line structures 301 may be recessed.

With reference to FIGS. 25 and 26, a recessing process may be performed to remove portions of the bit line capping layer 309, the first dielectric layer 109, and the bit line spacers 313. The recessing process may be, for example, isotropic dry etch, anisotropic dry etch, or wet etch. An etch rate ratio of the bit line capping layers 309 to the capacitor contact top conductive layers 407 may be between about 100:1 and about 10:1 or between 20:1 and about 10:1 during the recessing process. An etch rate ratio of the first dielectric layer 109 to the capacitor contact top conductive layers 407 may be between about 100:1 and about 10:1 or between 20:1 and about 10:1 during the recessing process. An etch rate ratio of the bit line spacers 313 to the capacitor contact top conductive layers 407 may be between about 100:1 and about 10:1 or between 20:1 and about 10:1 during the recessing process.

After the recessing process, the top surfaces 309TS of the bit line capping layers 309 may be recessed. That is, the capacitor contact top conductive layers 407 may protrude from the plane where the top surfaces 309TS of the bit line capping layers 309 located. The top surfaces 407TS of the capacitor contact top conductive layers 407 may be at a vertical level higher than a vertical level of the top surfaces 309TS of the bit line capping layers 309, the top surfaces 313TS of the bit line spacers 313, and the top surfaces of the first dielectric layer 109. In some embodiments, the top surfaces 309TS of the bit line capping layers 309, the top surfaces 313TS of the bit line spacers 313, and the top surfaces of the first dielectric layer 109 may be substantially coplanar.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

Figure 27:
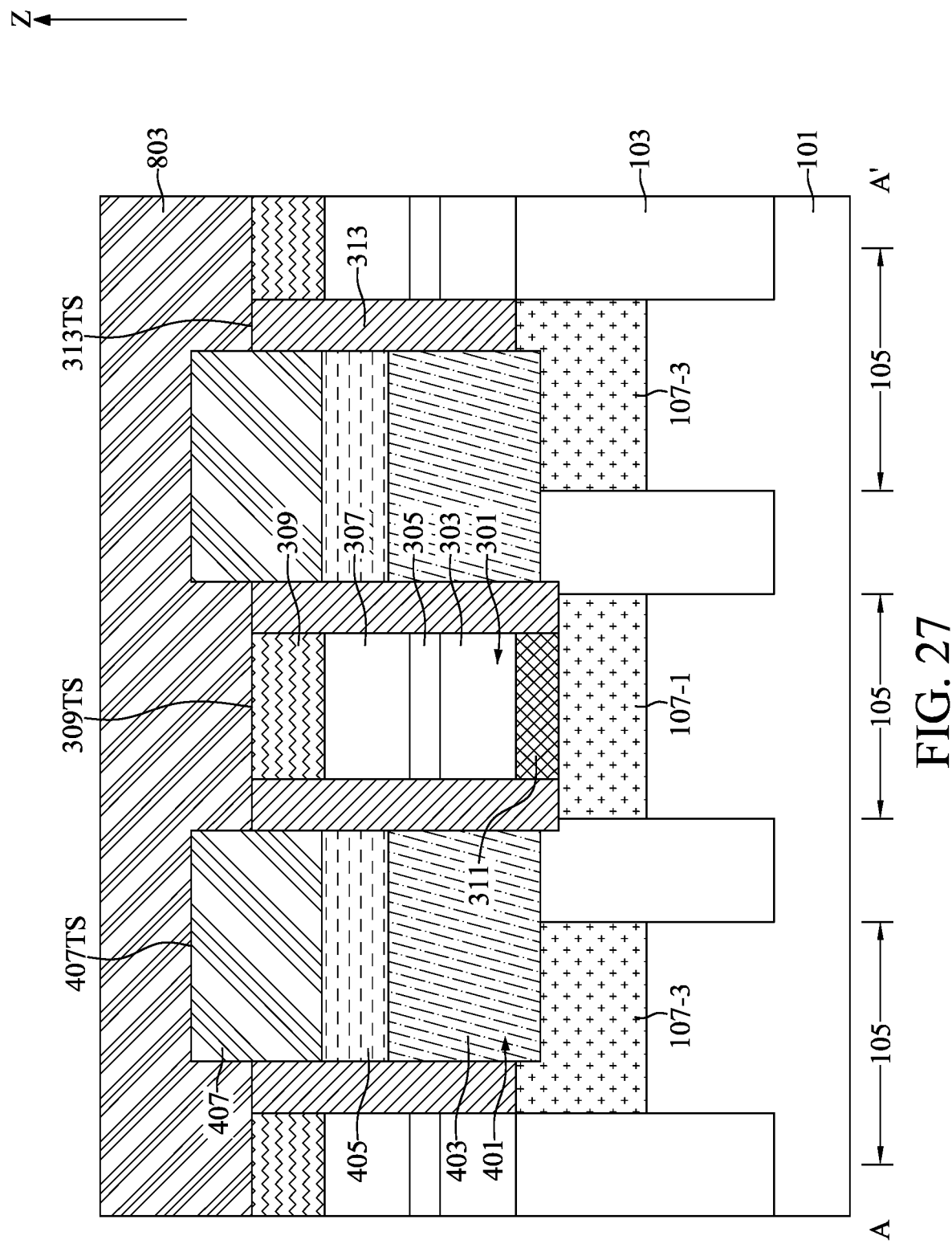
FIG. 27 is a schematic cross-sectional view diagram taken along the line A-A' in FIG. 22.
Figure 28:
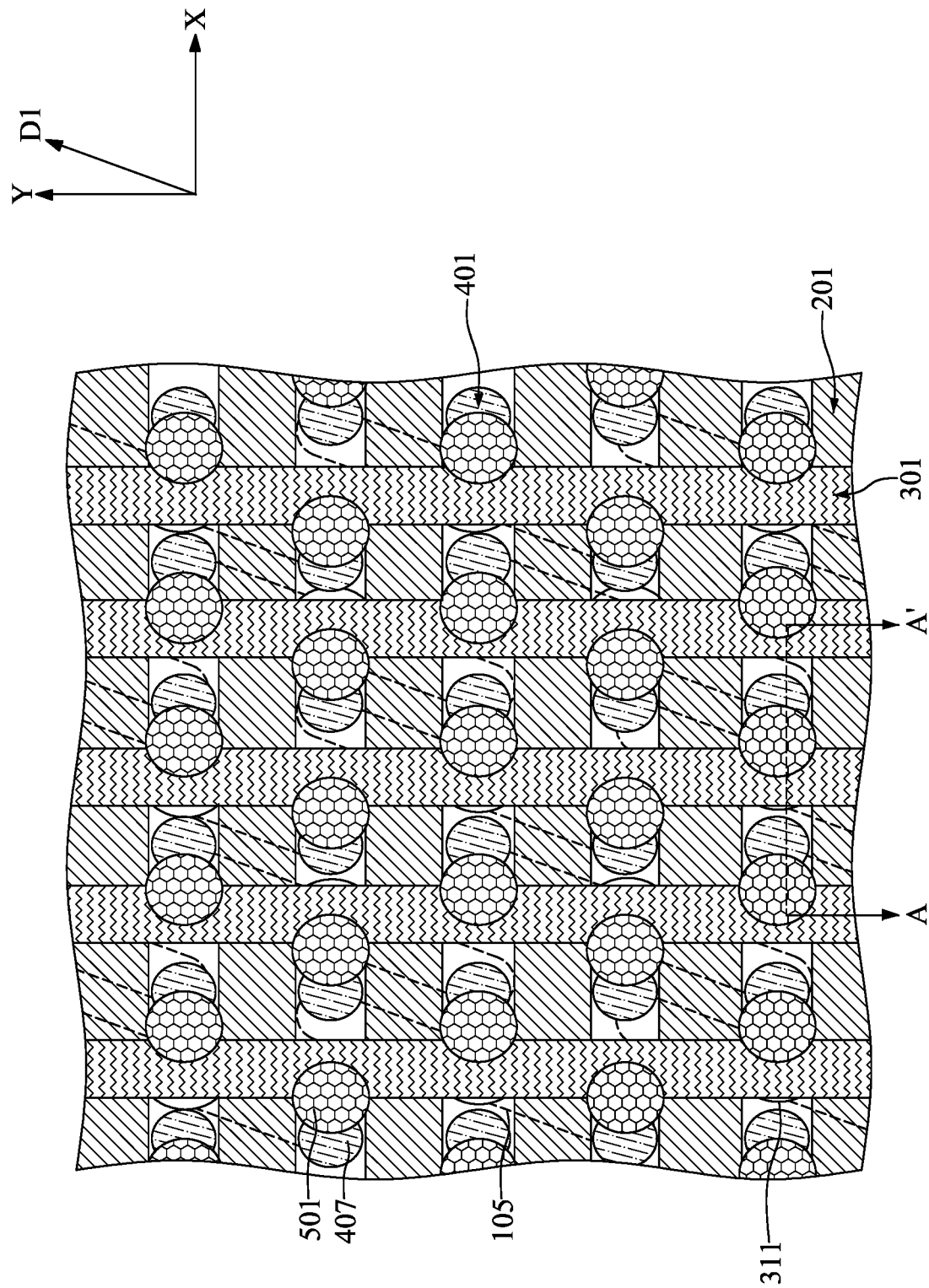
FIG. 28 illustrates, in a schematic top-view diagram, an intermediate semiconductor device in accordance with one embodiment of the present disclosure.
Figure 29:
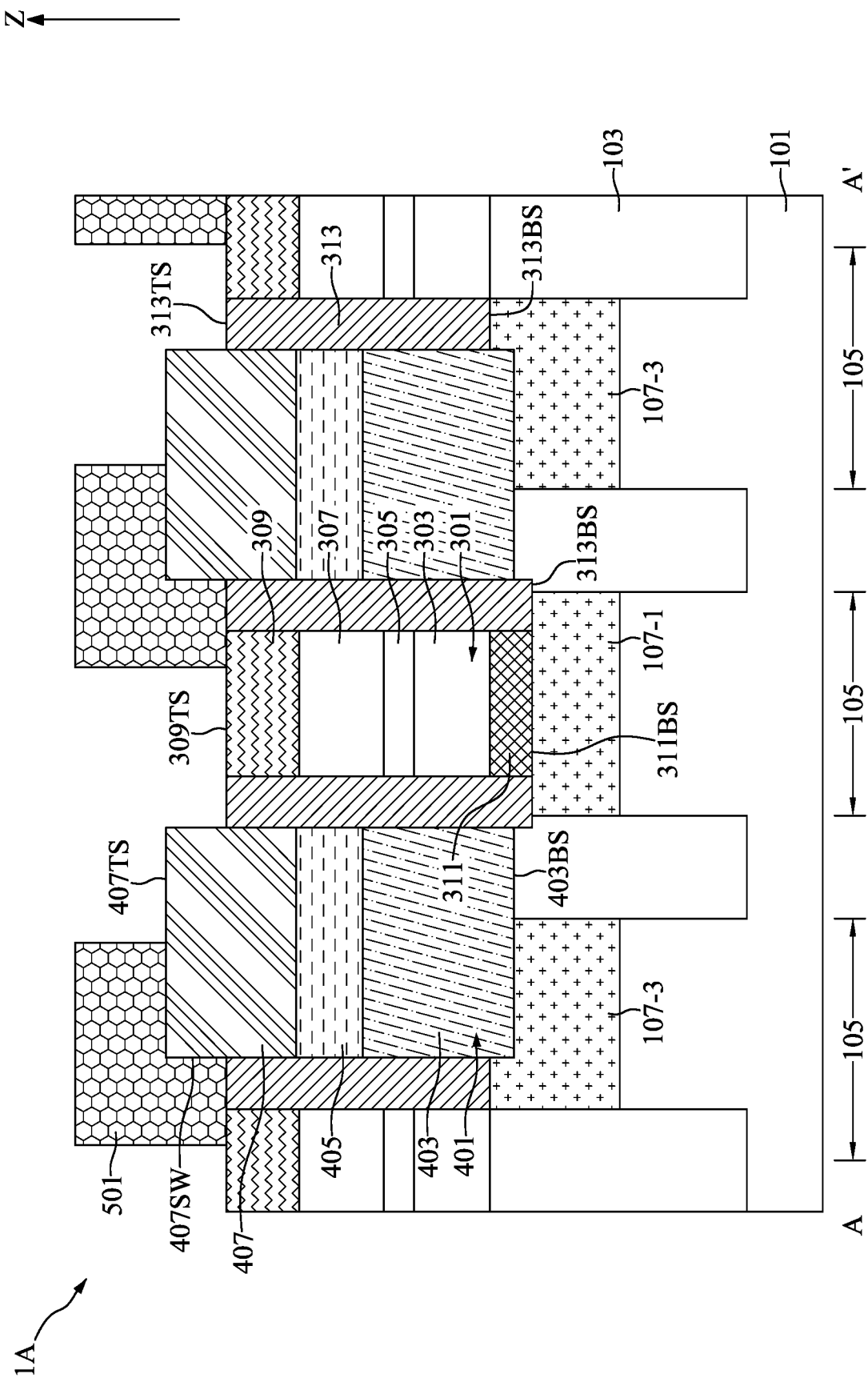
FIG. 29 is a schematic cross-sectional view diagram taken along the line A-A' in FIG. 28.

FIG. 27 is a schematic cross-sectional view diagram taken along the line A-A' in FIG. 22 illustrating part of the flow for fabricating the semiconductor device 1A in accordance with one embodiment of the present disclosure. FIG. 28 illustrates, in a schematic top-view diagram, an intermediate semiconductor device in accordance with one embodiment of the present disclosure. FIG. 29 is a schematic cross-sectional view diagram taken along the line A-A' in FIG. 28 illustrating part of the flow for fabricating the semiconductor device 1A in accordance with one embodiment of the present disclosure.

With reference to FIG. 1 and FIGS. 27 to 29, at step S23, landing pad layers 501 may be formed partially covered the capacitor contact structures 401.

With reference to FIG. 27, a layer of second conductive layer 803 may be formed to cover the capacitor contact top conductive layers 407, the bit line capping layers 309, and the bit line spacers 313. In some embodiments, the second conductive layer 803 may be formed of a material having etch selectivity to the capacitor contact top conductive layers 407. In some embodiments, the second conductive layer 803 may be, for example, tungsten, copper, or aluminum.

With reference to FIGS. 28 and 29, a photolithography process and a following etch process may be performed to remove portions of the layer of second conductive layer 803 and turn the layer of second conductive layer 803 into the landing pad layers 501. An etch rate ratio of the layer of second conductive layer 803 to the capacitor contact top conductive layers 407 may be between about 100:1 and about 10:1 or between about 20:1 and about 10:1 during the etch process.

For convenience of description, only one landing pad layer 501 and one capacitor contact top conductive layer 407 are described. In a cross-sectional perspective, the landing pad layer 501 may cover a portion of the top surface 407TS of the capacitor contact top conductive layer 407 and an upper portion of the sidewall 407SW of the capacitor contact top conductive layer 407. In other words, the landing pad layer 501 may partially cover the capacitor contact top conductive layer 407. In a top-view perspective, the landing pad layer 501 may offset from the capacitor contact top conductive layer 407.

The landing pad layer 501 partially covered the capacitor contact top conductive layer 407 may increase the contact surface between the landing pad layer 501 and the capacitor contact top conductive layer 407. Accordingly, the resistance between the landing pad layer 501 and the capacitor contact top conductive layer 407 may be reduced. As a result, the power consumption of the semiconductor device 1A may be reduced. In addition, the protruding capacitor contact top conductive layer 407 may provide strong enough supporting for the landing pad layer 501.

FIGS. 30 to 34 are schematic cross-sectional view diagrams taken along the line A-A' in FIG. 12 illustrating part of a flow for fabricating a semiconductor device 1B in accordance with another embodiment of the present disclosure.

Figure 30:
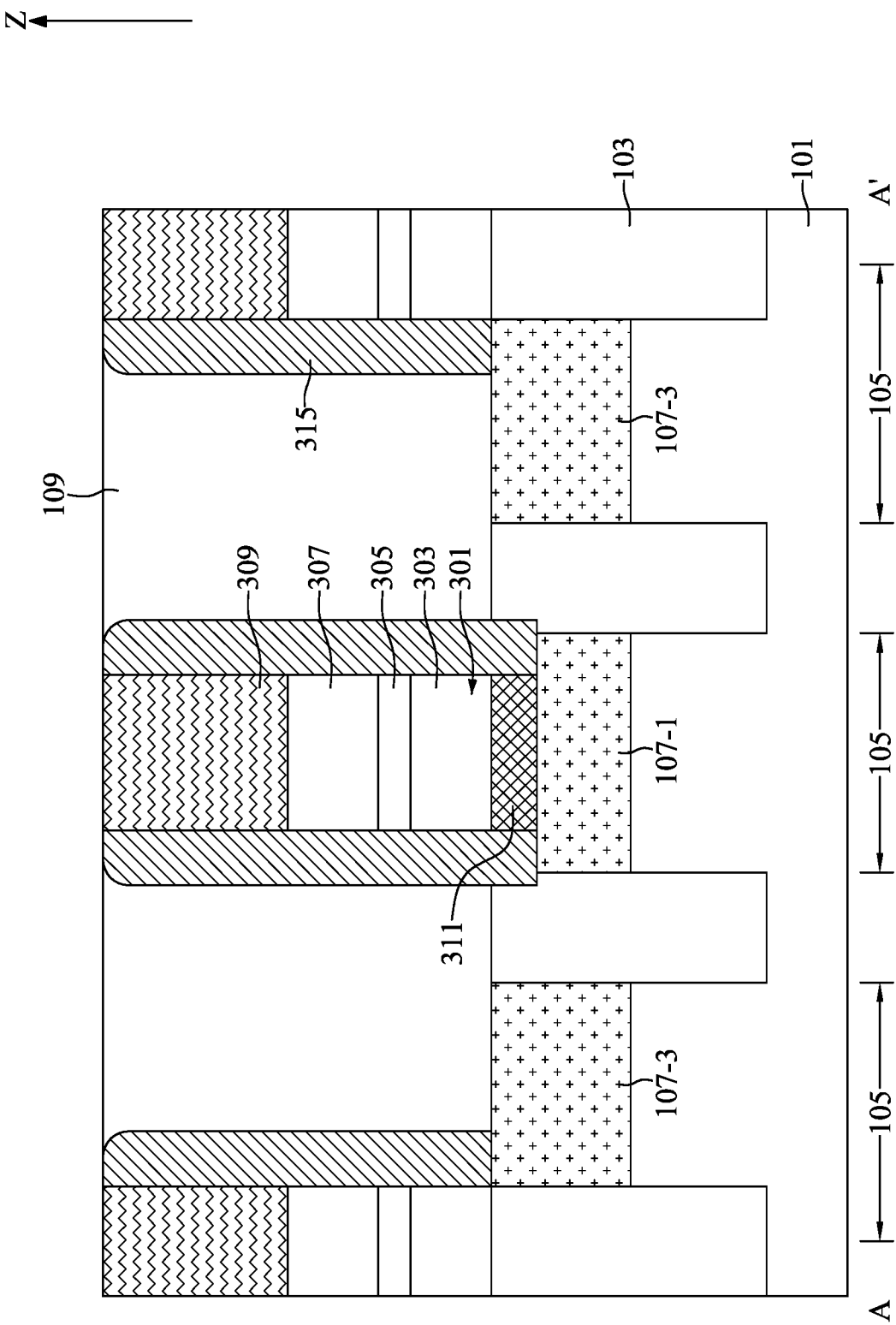
FIGS. 30 to 36 are schematic cross-sectional view diagrams taken along the line A-A' in FIG. 12 illustrating flows for fabricating semiconductor devices in accordance with some embodiment of the present disclosure.

With reference to FIG. 30, an intermediate semiconductor device similar to that illustrated in FIG. 13 may be provided. Sacrificial spacers 315 may be formed with a procedure similar to the bit line spacers 313 illustrated in the FIG. 13. In some embodiments, the sacrificial spacers 315 may be formed of a material having etching selectivity to the bit line capping layers 309 and the first dielectric layer 109. In some embodiments, the sacrificial spacers 315 may be formed of, for example, an energy-removable material such as a thermal decomposable material, a photonic decomposable material, an e-beam decomposable material, or a combination thereof. The first dielectric layer 109 may be formed with a procedure similar to that illustrated in FIG. 15.

Figure 31:
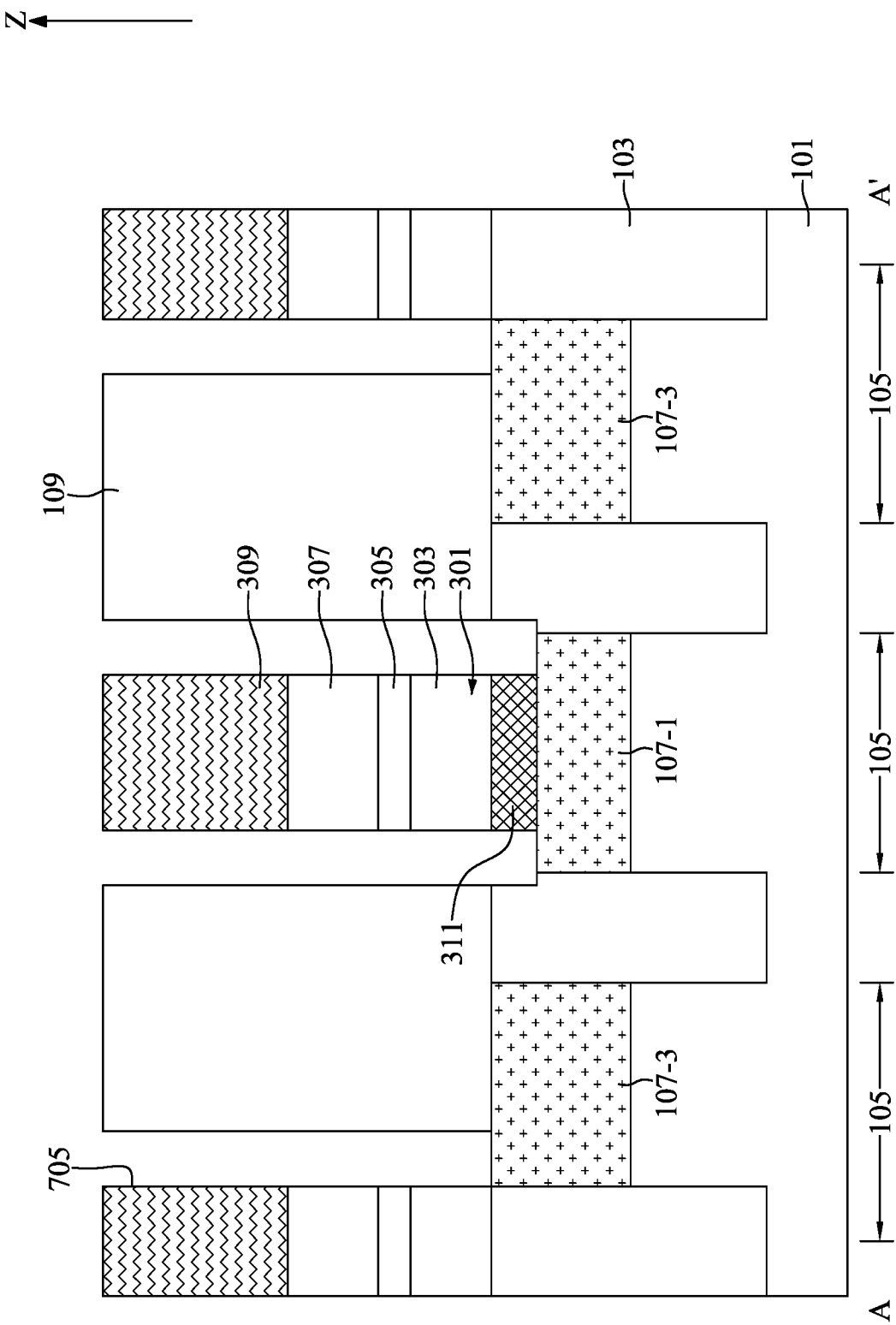

With reference to FIG. 31, in some embodiments, another planarization process may be applied to the intermediate semiconductor device illustrated in FIG. 30 to expose the top surfaces of the sacrificial spacers 315. In some embodiments, the planarization process for the first dielectric layer 109 may be performed until the top surfaces of the sacrificial spacers 315 are exposed. Subsequently, a removal process may be performed to remove the sacrificial spacers 315.

After the removal process, first trenches 705 may be formed in the places previously occupied by the sacrificial spacers 315.

In some embodiments, the removal process may be an etch process such as dry etch or wet etch. An etch rate ratio of the sacrificial spacers 315 to the first dielectric layer 109 may be between about 100:1 and about 10:1 or between about 20:1 and about 10:1 during the etch process. An etch rate ratio of the sacrificial spacers 315 to the bit line capping layer 309 may be between about 100:1 and about 10:1 or between about 20:1 and about 10:1 during the etch process.

In some embodiments, an energy treatment may be applied to remove the sacrificial spacers 315 formed of the energy-removable material. The energy treatment may be performed to the intermediate semiconductor device illustrated in FIG. 30 by applying an energy source thereto. The energy source may include heat, light, or a combination thereof. When heat is used as the energy source, a temperature of the energy treatment may be between about 800° C. and about 900° C. When light is used as the energy source, an ultraviolet light may be applied.

Figure 32:
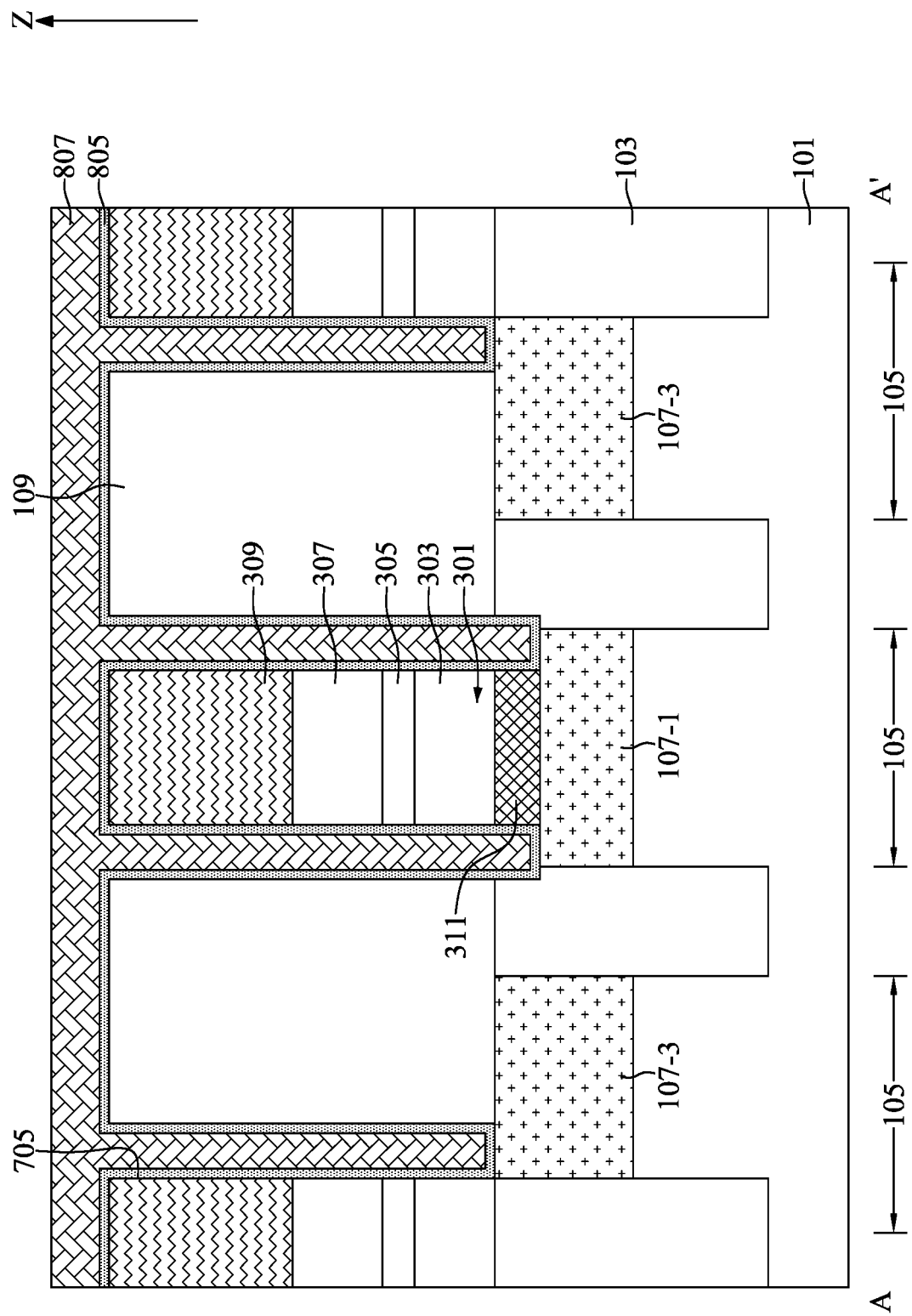

With reference to FIG. 32, a layer of first insulating material 805 may be conformally formed in the first trenches 705 and covered the first dielectric layer 109 and the bit line capping layers 309. A layer of second insulating material 807 may be formed on the layer of first insulating material 805 and may completely fill the first trenches 705.

In some embodiments, the first insulating material 805 may be, for example, silicon nitride, boron nitride, silicon boron nitride, phosphorus boron nitride, or boron carbon silicon nitride. In some embodiments, the second insulating material 807 may be, for example, silicon oxide.

Figure 33:
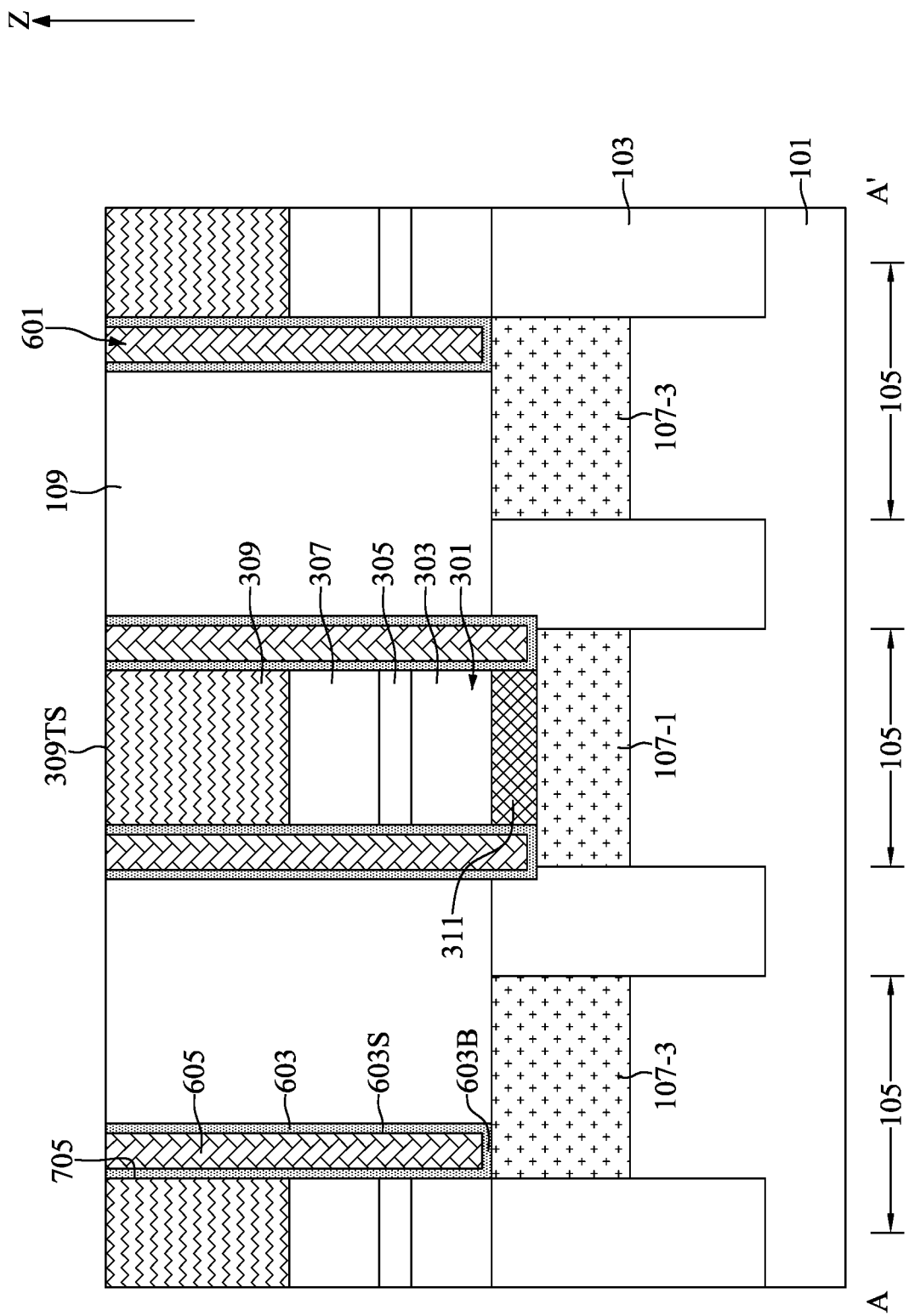

With reference to FIG. 33, a planarization process, such as chemical mechanical polishing, may be performed until the top surface of the bit line capping layers 309 are exposed to remove excess material and provide a substantially flat surface for subsequent processing steps. After the planarization process, the layer of first insulating material 805 may be turned into first insulating layers 603. The layer of second insulating material 807 may be turned into second insulating layers 605. The first insulating layers 603 and the second insulating layers 605 together form insulation structures 601.

For convenience of description, only one insulation structure 601 is described. The first insulating layer 603 may have an U-shaped cross-sectional profile. The first insulating layer 603 may include a bottom portion 603B and two side portions 603S. The bottom portion 603B may be line shape and may be horizontally disposed on the substrate 101, especially, on the drain region 107-3. The two side portions 603S may be line shape and may be vertically connected to two ends of the bottom portion 603B. One of the two side portions 603S may be attached to the sidewall of the bit line structures 301 and the other one of the two side portions may be attached to the sidewall of the capacitor contact structures 401. The second insulating layer 605 may be disposed among the bottom portion 603B and the two side portions 603S. In some embodiments, the bottom portion 603B may be horizontally disposed in the substrate 101 and on the source region 107-1. One of the two side portions 603S may be attached to the sidewall of the capacitor contact structures 401 and the sidewall of the bit line contact 311.

Figure 34:
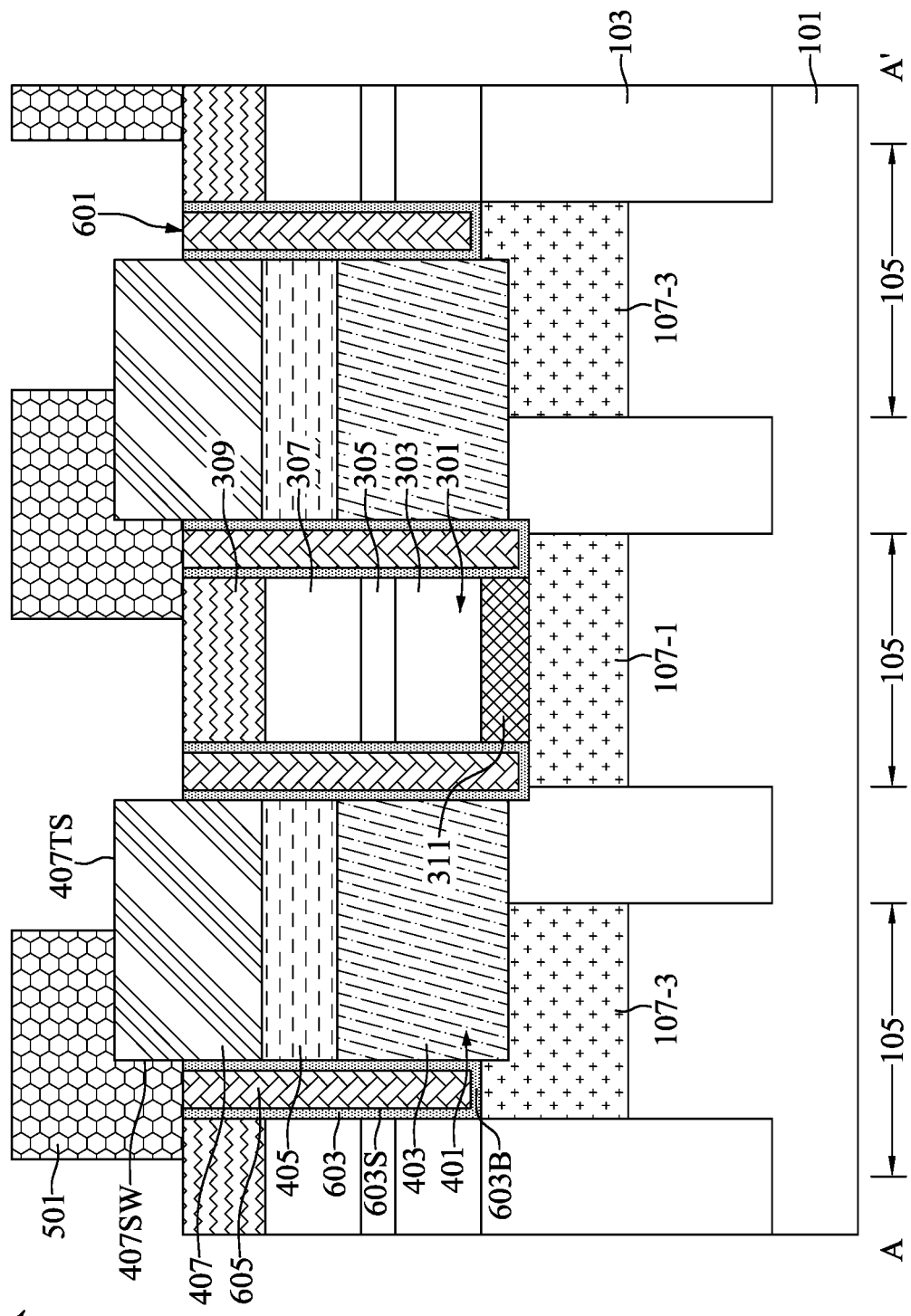

With reference to FIG. 34, the capacitor contact structures 401 may be formed with a procedure similar to that illustrated in FIGS. 17 to 24. The recessing process may be performed with a procedure similar to that illustrated in FIG. 25. The landing pad layers 501 may be formed with a procedure similar to that illustrated in FIGS. 27 to 29. The landing pad layers 501 may be formed covered some of the insulation structures 601.

Figure 35:
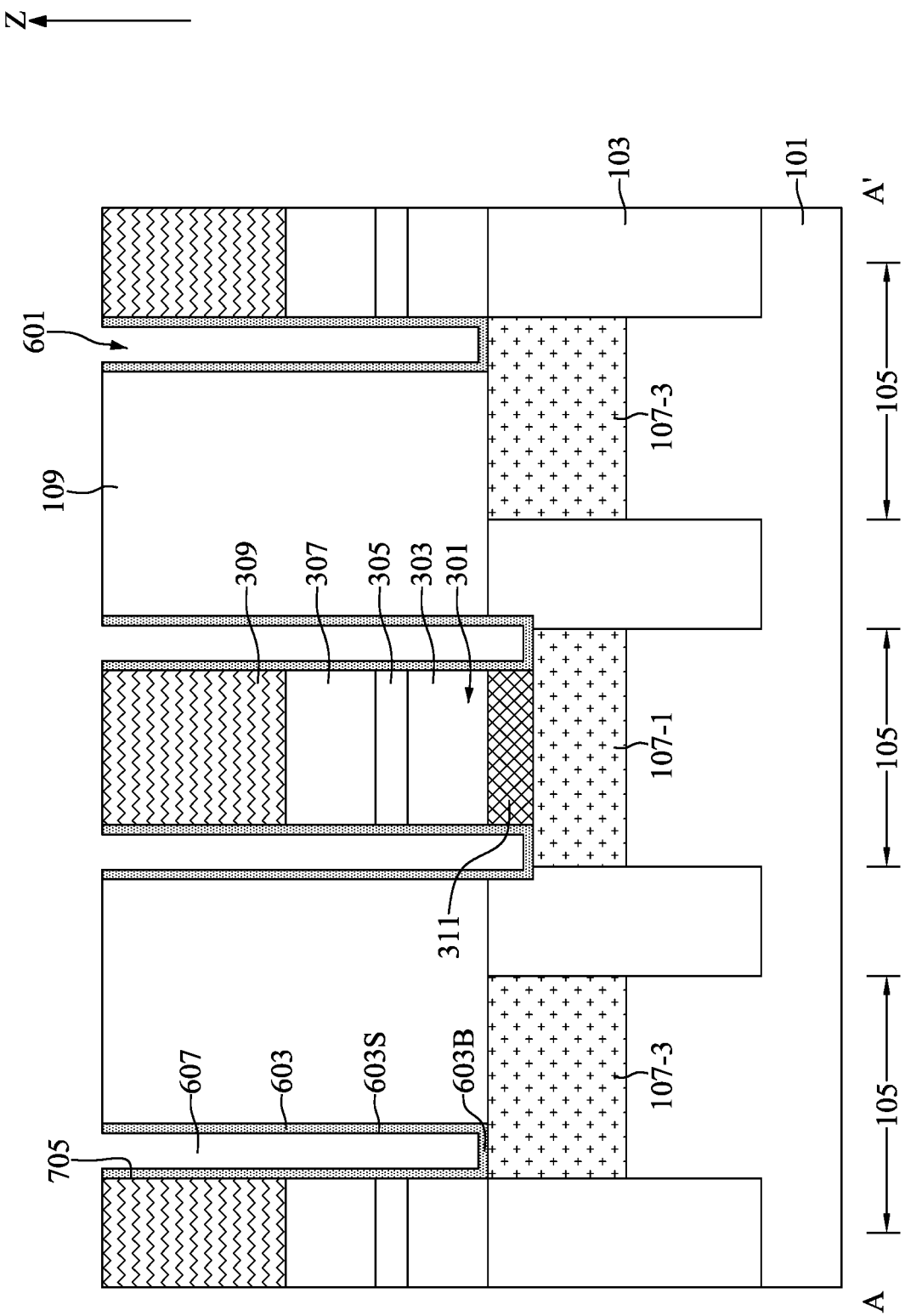
Figure 36:
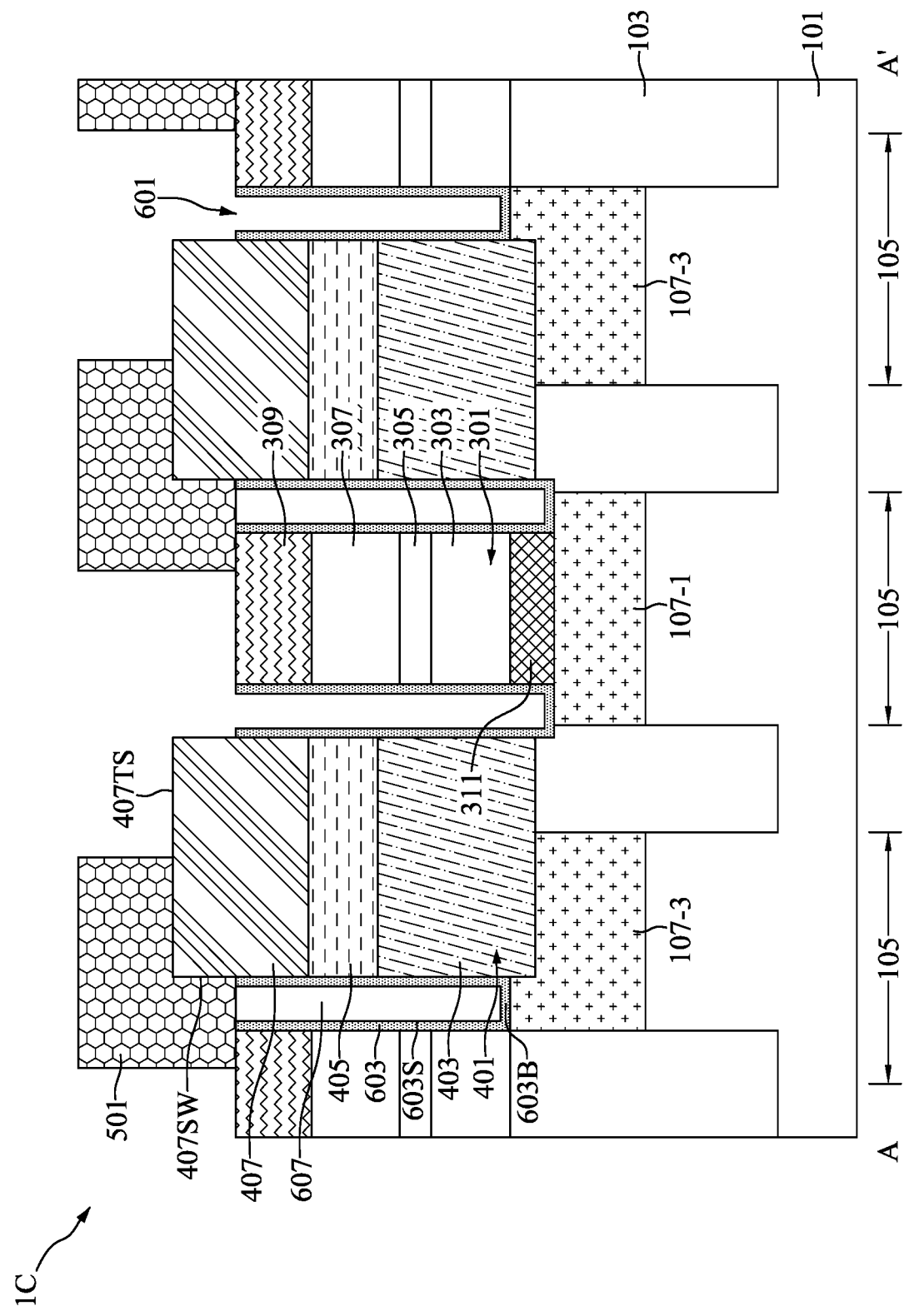

FIGS. 35 and 36 are schematic cross-sectional view diagrams taken along the line A-A' in FIG. 12 illustrating part of a flow for fabricating a semiconductor device 1C in accordance with another embodiment of the present disclosure.

With reference to FIG. 35, an intermediate semiconductor device illustrated in FIG. 33 may be provided. A removal process may be performed to remove the second insulating layers 605 (as shown in FIG. 33). The airgaps 607 may be concurrently formed in the places previously occupied by the second insulating layers 605. Specifically, each of the air gaps 607 may be formed among the bottom portion 603B and the two side portions 603S. The first insulating layers 603 and the air gaps 607 may together form the insulation structures 601. The air gaps 607 may reduce the parasitic capacitance of between the capacitor contact structures 401 and the bit line structures 301. As a result, the performance of the semiconductor device 1C may be improved.

In some embodiments, the second insulating layer 605 may be formed of a material having etch selectivity to the first insulating layer 603. The removal process may be an etch process such as dry etch or wet etch. An etch rate ratio of the second insulating layers 605 to the first insulating layers 603 may be between about 100:1 and about 10:1 or between about 20:1 and about 10:1 during the etch process. An etch rate ratio of the second insulating layers 605 to the first dielectric layer 109 may be between about 100:1 and about 10:1 or between about 20:1 and about 10:1 during the etch process. An etch rate ratio of the second insulating layers 605 to the bit line capping layers 309 may be between about 100:1 and about 10:1 or between about 20:1 and about 10:1 during the etch process.

In some embodiments, the second insulating layers 605 may be formed of, for example, an energy-removable material such as a thermal decomposable material, a photonic decomposable material, an e-beam decomposable material, or a combination thereof. The removal process may be applied an energy treatment to remove the second insulating layers 605. The energy treatment may be performed by applying an energy source to the second insulating layers 605. The energy source may include heat, light, or a combination thereof. When heat is used as the energy source, a temperature of the energy treatment may be between about 800° C. and about 900° C. When light is used as the energy source, an ultraviolet light may be applied.

With reference to FIG. 36, the capacitor contact structures 401 may be formed with a procedure similar to that illustrated in FIGS. 17 to 24. The recessing process may be performed with a procedure similar to that illustrated in FIG. 25. The landing pad layers 501 may be formed with a procedure similar to that illustrated in FIGS. 17 to 29. The landing pad layers 501 may be formed covered some of the insulation structures 601.

Figure 37:
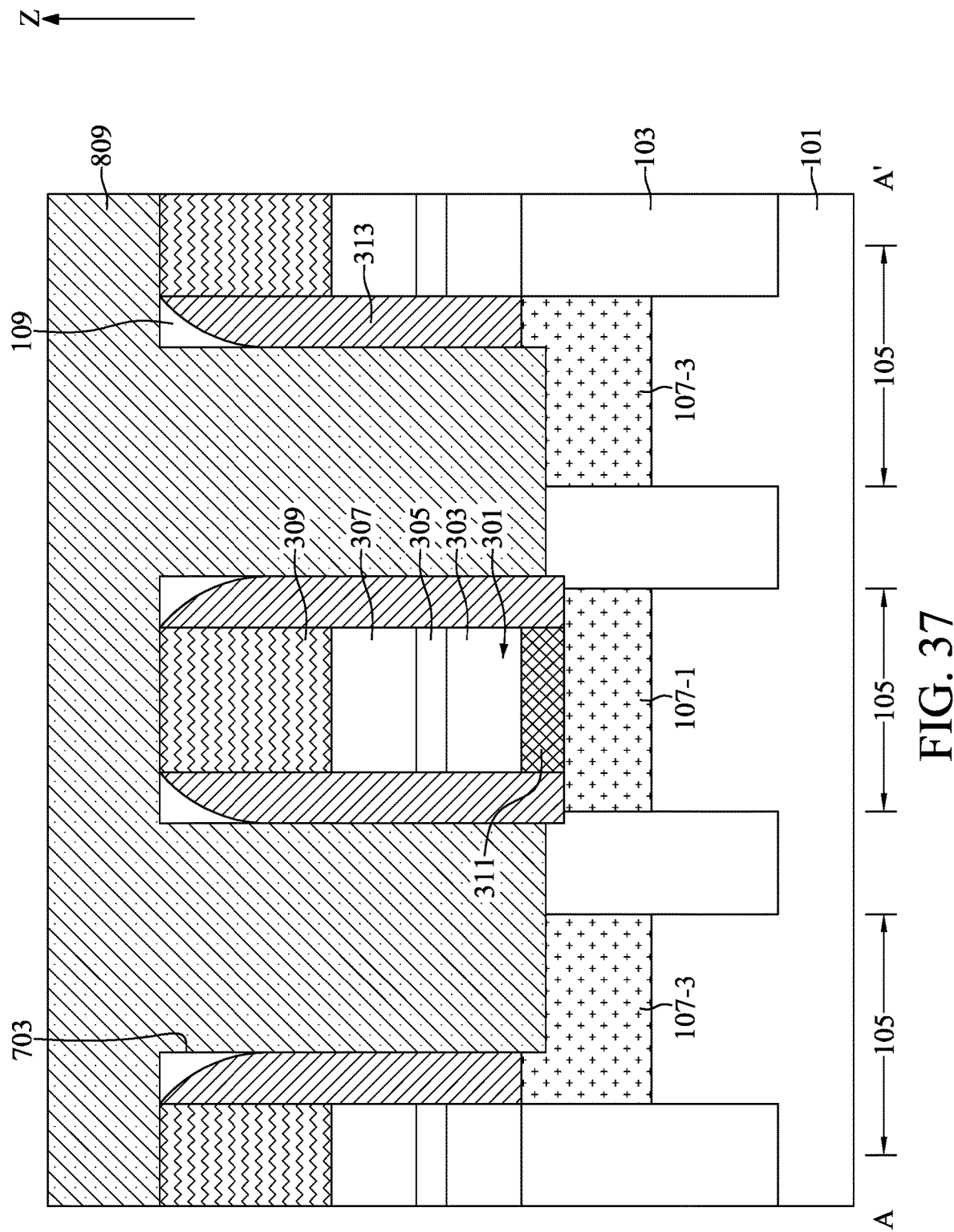
Figure 38:
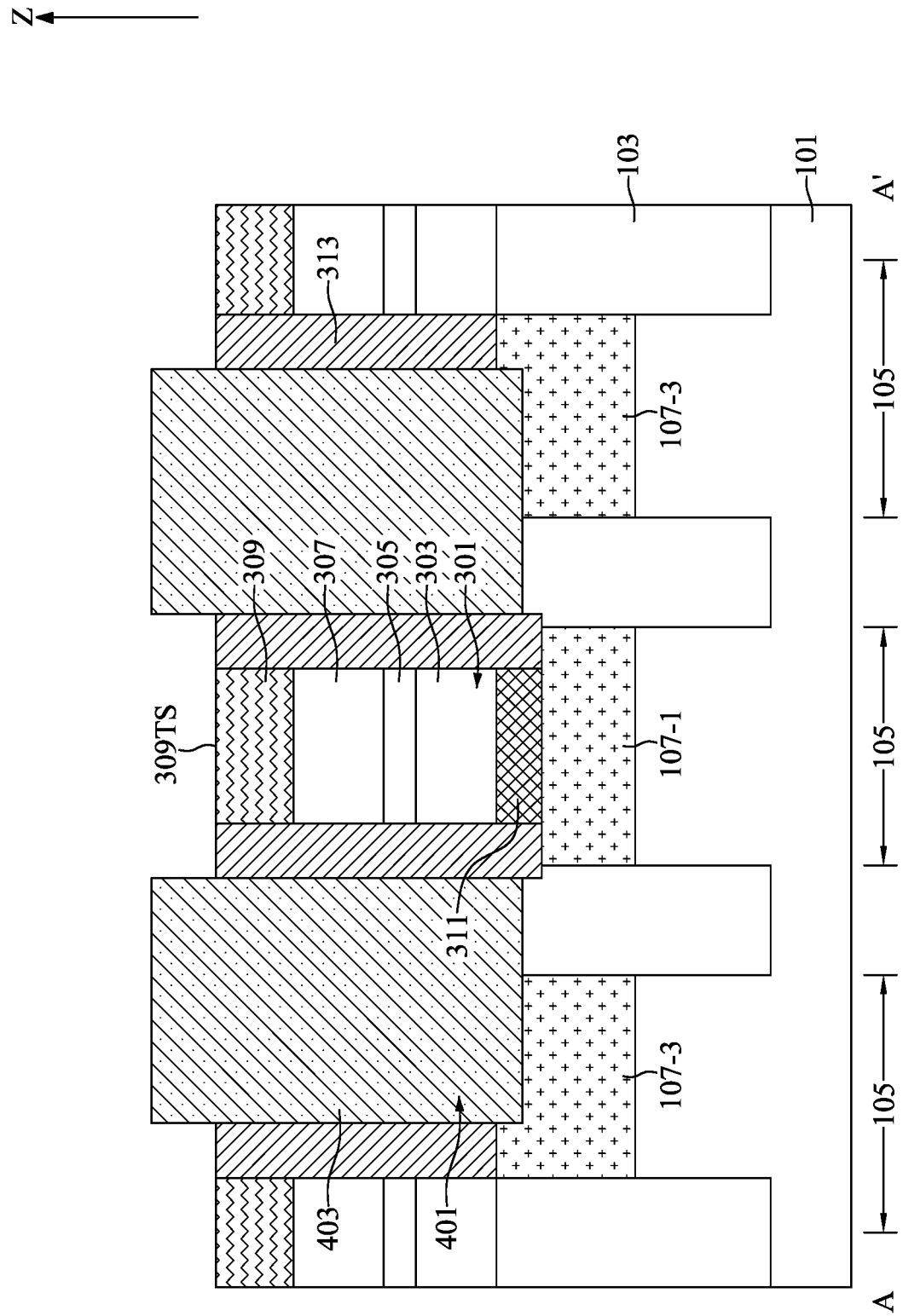
Figure 39:
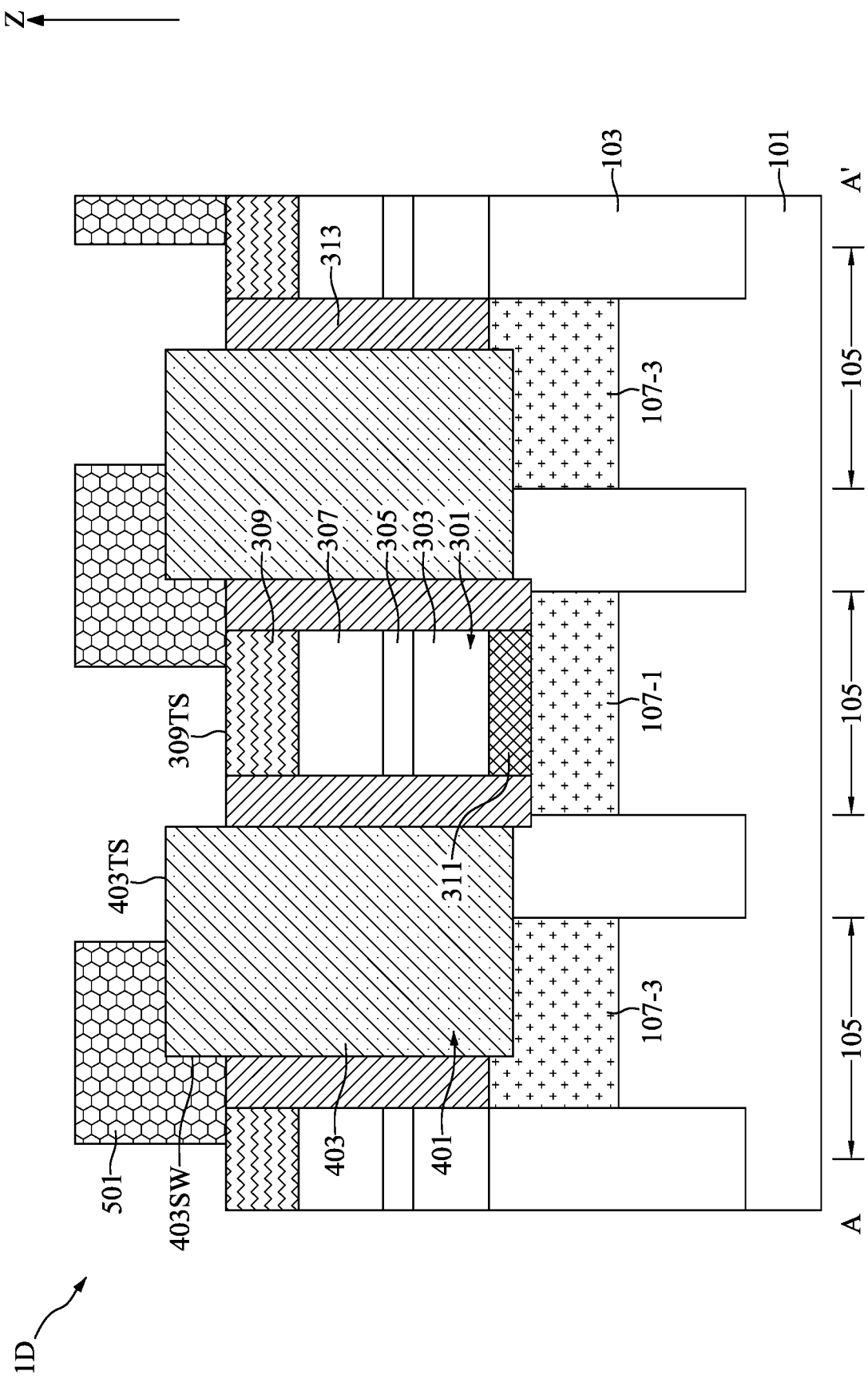

FIGS. 37 to 39 are schematic cross-sectional view diagrams taken along the line A-A' in FIG. 17 illustrating part of a flow for fabricating a semiconductor device 1D in accordance with another embodiment of the present disclosure.

With reference to FIG. 37, an intermediate semiconductor device illustrated in FIG. 18 may be provided. A layer of third conductive material 809 may be formed to completely fill the capacitor contact openings 703 and cover the bit line structures 301 and the first dielectric layer 109. The third conductive material 809 may be, for example, polycrystalline silicon, polycrystalline germanium, or polycrystalline silicon germanium.

With reference to FIG. 38, a procedure similar to that illustrated in FIGS. 22 to 25 may be performed to the layer of third conductive material 809. The layer of third conductive material 809 may be turned into the capacitor contact structures 401. Each of the capacitor contact structures 401 may only include a capacitor contact bottom conductive layer 403 formed of polycrystalline silicon, polycrystalline germanium, or polycrystalline silicon germanium. The capacitor contact bottom conductive layer 403 may protrude from the plane where the top surfaces 309TS of the bit line capping layers 309 located.

With reference to FIG. 39, the landing pad layers 501 may be formed with a procedure similar to that illustrated in FIGS. 27 to 29. The landing pad layer 501 may partially cover the capacitor contact bottom conductive layer 403. Specifically, the landing pad layer 501 may cover a portion of the top surface 403TS of the capacitor contact bottom conductive layer 403 and an upper portion of the sidewall 403SW of the capacitor contact bottom conductive layer 403.

Figure 40:
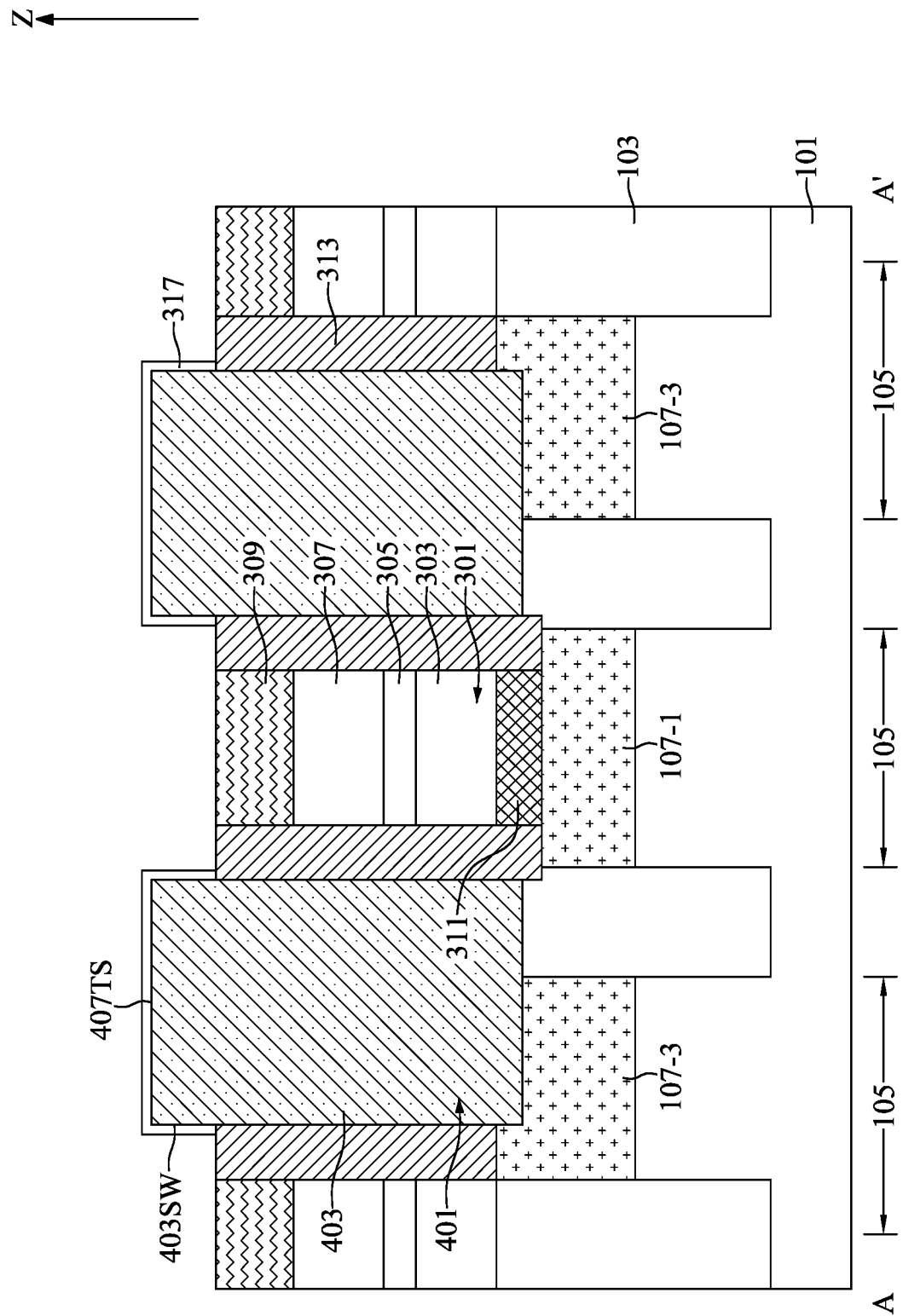
Figure 41:
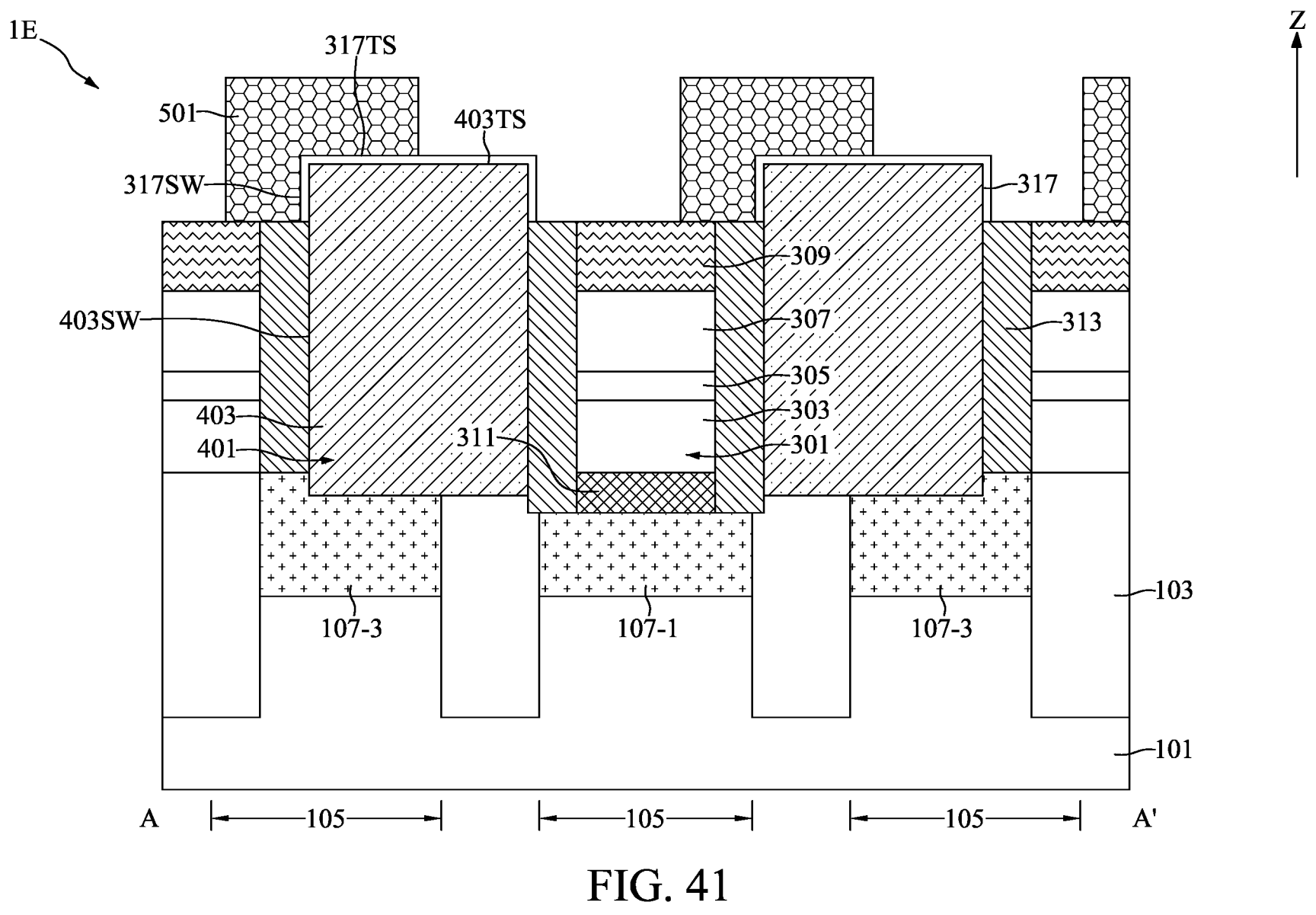

FIGS. 40 and 41 are schematic cross-sectional view diagrams taken along the line A-A' in FIG. 17 illustrating part of a flow for fabricating a semiconductor device 1E in accordance with another embodiment of the present disclosure.

With reference to FIG. 40, an intermediate semiconductor device illustrated in FIG. 38 may be provided. Subsequently, a layer of conductive material (Not shown) may be formed over the intermediate semiconductor device illustrated in FIG. 38. The conductive material may include, for example, titanium, nickel, platinum, tantalum, or cobalt. A thermal treatment may be performed. During the thermal treatment, metal atoms of the layer of conductive material may react chemically with silicon atoms of the capacitor contact bottom conductive layers 403 to form adjustment layers 317. The adjustment layers 317 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution.

The adjustment layers 317 may have thickness between about 2 nm and about 20 nm. Each of the adjustment layers 317 may cover the top surface 403TS of the capacitor contact bottom conductive layer 403 and the upper portions of the sidewalls 403SW of the capacitor contact bottom conductive layer 403.

With reference to FIG. 41, the landing pad layers 501 may be formed with a procedure similar to that illustrated in FIGS. 27 to 29. The landing pad layer 501 may partially cover the adjustment layer 317. Specifically, the landing pad layer 501 may cover a portion of the top surface 317TS of the adjustment layer 317 and one of the sidewalls 317SW of the adjustment layer 317.

Figure 42:
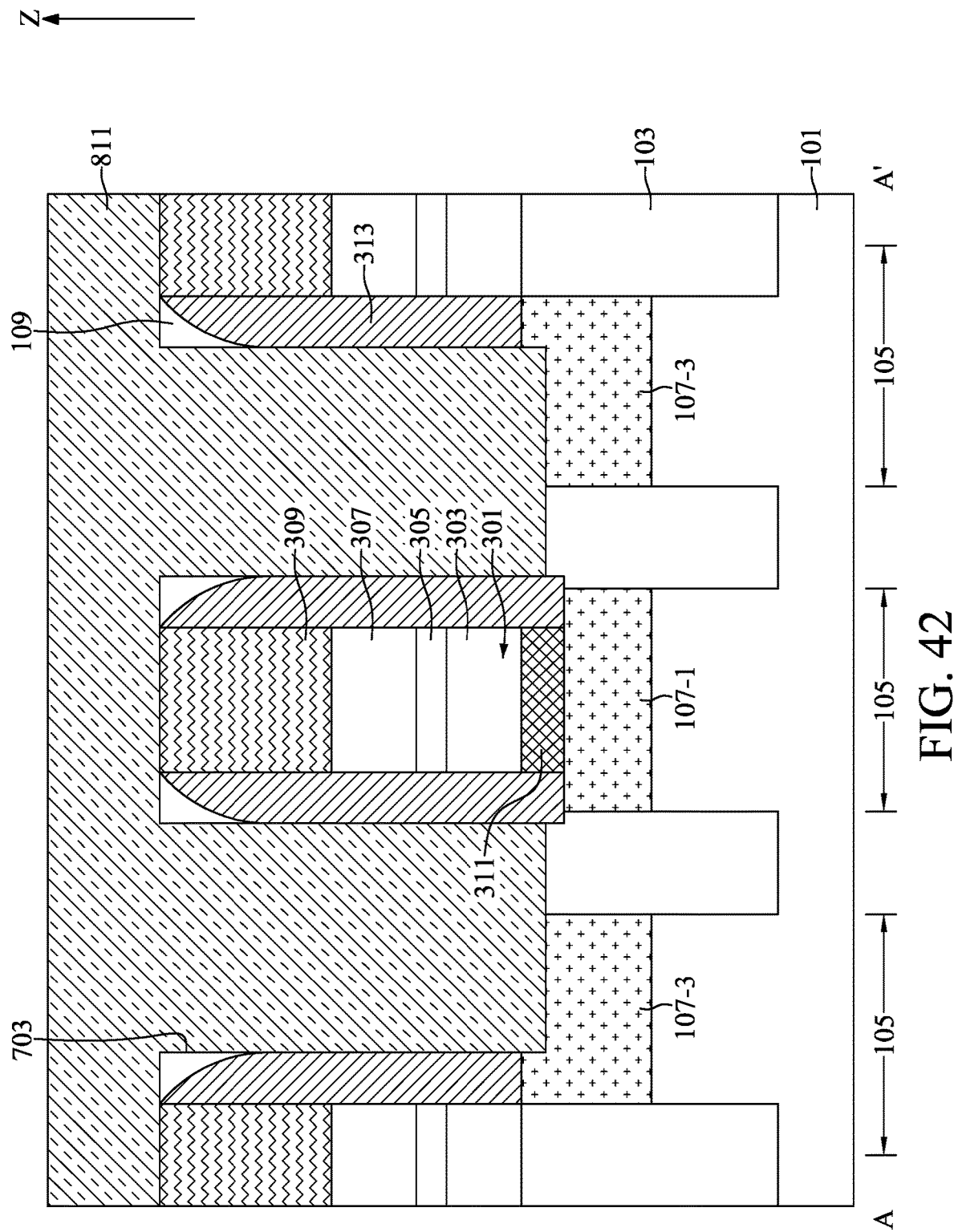
Figure 43:
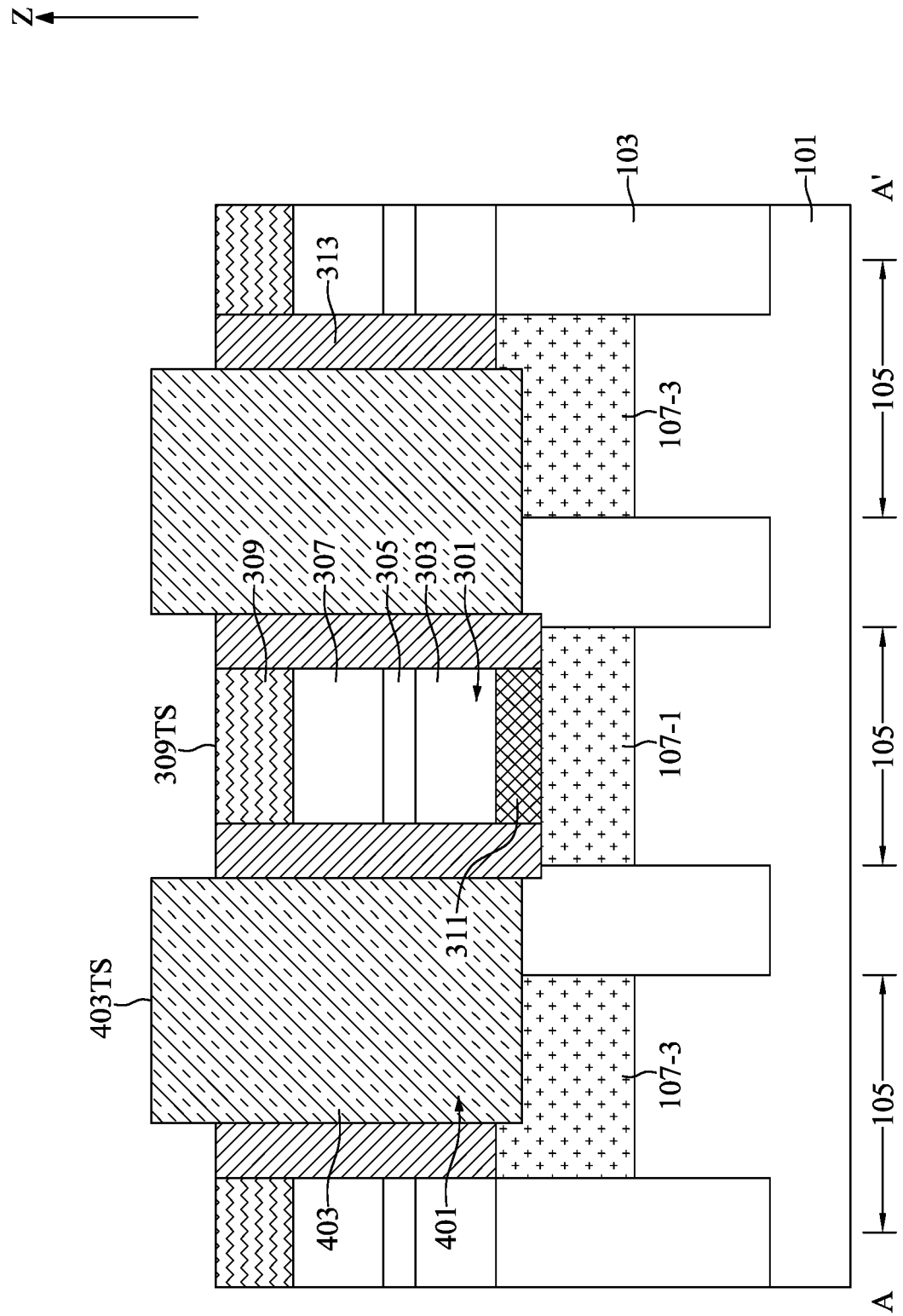
Figure 44:
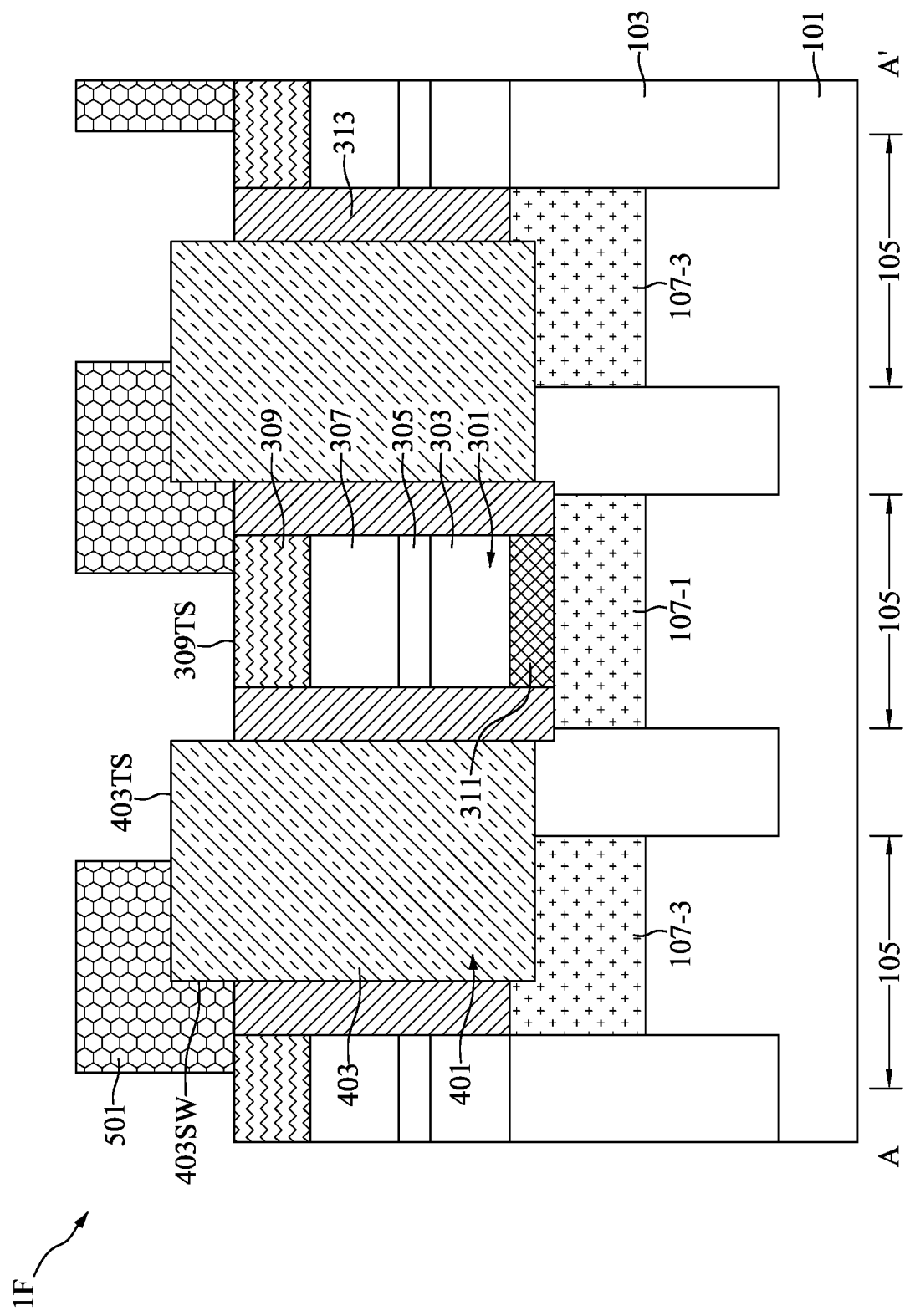

FIGS. 42 to 44 are schematic cross-sectional view diagrams taken along the line A-A' in FIG. 17 illustrating part of a flow for fabricating a semiconductor device 1F in accordance with another embodiment of the present disclosure.

With reference to FIG. 42, an intermediate semiconductor device illustrated in FIG. 18 may be provided. A layer of fourth conductive material 811 may be formed to completely fill the capacitor contact openings 703 and cover the bit line structures 301 and the first dielectric layer 109. The fourth conductive material 811 may be, for example, titanium nitride or tantalum nitride.

With reference to FIG. 43, a procedure similar to that illustrated in FIGS. 22 to 25 may be performed to the layer of fourth conductive material 811. The layer of fourth conductive material 811 may be turned into the capacitor contact structures 401. Each of the capacitor contact structures 401 may only include a capacitor contact bottom conductive layer 403 formed of titanium nitride or tantalum nitride. The capacitor contact bottom conductive layer 403 may protrude from the plane where the top surfaces 309TS of the bit line capping layers 309 located.

With reference to FIG. 44, the landing pad layers 501 may be formed with a procedure similar to that illustrated in FIGS. 27 to 29. The landing pad layer 501 may partially cover the capacitor contact bottom conductive layer 403. Specifically, the landing pad layer 501 may cover a portion of the top surface 403TS of the capacitor contact bottom conductive layer 403 and an upper portion of the sidewall 403SW of the capacitor contact bottom conductive layer 403.

One aspect of the present disclosure provides a semiconductor device including a substrate, a capacitor contact structure protruding from the substrate, and a landing pad layer covering a portion of a top surface of the capacitor contact structure and an upper portion of a sidewall of the capacitor contact structure.

Another aspect of the present disclosure provides a method for fabricating a semiconductor device including providing a substrate, forming a bit line structure on the substrate, forming a capacitor contact structure next to the bit line structure, recessing a top surface of the bit line structure, and forming a landing pad layer covering a portion of a top surface of the capacitor contact structure and an upper portion of a sidewall of the capacitor contact structure.

Due to the design of the semiconductor device of the present disclosure, the contact surface between the landing pad layer 501 and the capacitor contact top conductive layer 407 may be increased. Accordingly, the resistance between the landing pad layer 501 and the capacitor contact top conductive layer 407 may be reduced. As a result, the power consumption of the semiconductor device 1A may be reduced. In addition, the protruding capacitor contact top conductive layer 407 may provide strong enough supporting for the landing pad layer 501.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a bit line structure on the substrate;
   forming a capacitor contact structure next to the bit line structure;
   recessing a top surface of the bit line structure; and
   forming a landing pad layer covering a portion of a top surface of the capacitor contact structure and an upper portion of a sidewall of the capacitor contact structure.

2. The method for fabricating the semiconductor device of claim 1, wherein the step of forming a bit line structure comprises forming a bit line bottom conductive layer on the substrate, forming a bit line middle conductive layer on the bit line bottom conductive layer, forming a bit line top conductive layer on the bit line middle conductive layer, and forming a bit line capping layer on the bit line top conductive layer.

3. The method for fabricating the semiconductor device of claim 2, wherein the step of forming a landing pad layer comprises:
   forming a conductive layer covering an upper portion of the capacitor contact structure; and
   performing an etch process to turn the conductive layer into the landing pad layer;
   wherein an etch rate ratio of the conductive layer to the capacitor contact structure is between about 100:1 and about 10:1 during the etch process.

4. The method for fabricating the semiconductor device of claim 3, wherein the capacitor contact structure comprises polycrystalline silicon, polycrystalline germanium, polycrystalline silicon germanium, cobalt silicide, titanium silicide, nickel silicide, nickel platinum silicide, or tantalum silicide, titanium nitride, or tantalum nitride.

5. The method for fabricating the semiconductor device of claim 1, wherein a top surface of the bit line structure is at a vertical level lower than a vertical level of the top surface of the capacitor contact structure.

6. The method for fabricating the semiconductor device of claim 1, further comprising: forming a bit line spacer between the capacitor contact structure and the bit line structure, wherein a top surface of the bit line spacer is substantially coplanar with the top surface of the bit line structure.

7. The method for fabricating the semiconductor device of claim 1, wherein the step of forming a capacitor contact structure comprises:
   forming a capacitor contact bottom conductive layer protruding from the substrate;
   forming a capacitor contact middle conductive layer on the capacitor contact bottom conductive layer, and
   forming a capacitor contact top conductive layer on the capacitor contact middle conductive layer, wherein the landing pad layer covers a portion of a top surface of the capacitor contact top conductive layer and an upper portion of a sidewall of the capacitor contact top conductive layer.

8. The method for fabricating the semiconductor device of claim 1, wherein the capacitor contact bottom conductive layer comprises polycrystalline silicon, polycrystalline germanium, or polycrystalline silicon germanium, the capacitor contact middle conductive layer is of cobalt silicide, titanium silicide, nickel silicide, nickel platinum silicide, or tantalum silicide, and the capacitor contact top conductive layer is of titanium nitride or tantalum nitride.

9. The method for fabricating the semiconductor device of claim 8, wherein a bottom surface of the capacitor contact structure is at a vertical level lower than a vertical level of a bottom surface of the bit line spacer.

10. The method for fabricating the semiconductor device of claim 8, further comprising: forming a bit line contact under the bit line bottom conductive layer.

11. The method for fabricating the semiconductor device of claim 10, wherein a bottom surface of the bit line spacer is substantially coplanar with a bottom surface of the bit line contact.

12. The method for fabricating the semiconductor device of claim 11, further comprising: forming source/drain regions under the bit line contact and the capacitor contact structure.

13. The method for fabricating the semiconductor device of claim 1, further comprising an insulation structure between the bit line structure and the capacitor contact structure, wherein the insulation structure comprises a first insulating layer and a second insulating layer, wherein the first insulating layer comprises a bottom portion horizontally on the substrate and two side portions vertically connected to two ends of the bottom portion, and the second insulating layer is among the bottom portion and the two side portions.

14. The method for fabricating the semiconductor device of claim 13, wherein the first insulating layer is of silicon nitride and the second insulating layer is of silicon oxide.

15. The method for fabricating the semiconductor device of claim 1, further comprising an insulation structure between the bit line structure and the capacitor contact structure, wherein the insulation structure comprises a first insulating layer and an air gap, wherein the first insulating layer comprises a bottom portion horizontally on the substrate and two side portions vertically connected to two ends of the bottom portion, and the air gap is among the bottom portion and the two side portions.

16. The method for fabricating the semiconductor device of claim 15, wherein the capacitor contact structure comprises a capacitor contact bottom conductive layer protruding from the substrate, the landing pad layer covers a portion of a top surface of the capacitor contact bottom conductive layer and an upper portion of a sidewall of the capacitor contact bottom conductive layer, and the capacitor contact bottom conductive layer is of polycrystalline silicon, polycrystalline germanium, or polycrystalline silicon germanium.

17. The method for fabricating the semiconductor device of claim 16, further comprising: forming an adjustment layer between the landing pad layer and the capacitor contact bottom conductive layer, wherein the adjustment layer is of cobalt silicide, titanium silicide, nickel silicide, nickel platinum silicide, or tantalum silicide.

18. The method for fabricating the semiconductor device of claim 17, wherein the capacitor contact structure comprises a capacitor contact bottom conductive layer protruding from the substrate, the landing pad layer covers a portion of a top surface of the capacitor contact bottom conductive layer and an upper portion of a sidewall of the capacitor contact bottom conductive layer, and the capacitor contact bottom conductive layer is of titanium nitride or tantalum nitride.

* * * * *